(12) United States Patent
Lu et al.

(10) Patent No.: US 8,901,247 B2
(45) Date of Patent: Dec. 2, 2014

(54) RESPONSIVE POLYMER SYSTEM AND NANOHYBRID THIN FILMS

(75) Inventors: Jennifer Lu, Merced, CA (US);
Shuhuai Xiang, Merced, CA (US)

(73) Assignee: The Regents of the University of California, Oakland, CA (US)

( * ) Notice: Subject to any disclaimer, the term of this patent is extended or adjusted under 35 U.S.C. 154(b) by 550 days.

(21) Appl. No.: 13/118,291

(22) Filed: May 27, 2011

(65) Prior Publication Data

US 2012/0038249 A1    Feb. 16, 2012

Related U.S. Application Data

(60) Provisional application No. 61/349,797, filed on May 28, 2010, provisional application No. 61/350,823, filed on Jun. 2, 2010.

(51) Int. Cl.

| | | |
|---|---|---|
| *H01L 41/193* | (2006.01) | |
| *H02N 2/18* | (2006.01) | |
| *C08G 77/455* | (2006.01) | |
| *C08G 69/02* | (2006.01) | |
| *C08G 69/26* | (2006.01) | |
| *B82Y 30/00* | (2011.01) | |
| *C08L 77/06* | (2006.01) | |
| *C08G 69/28* | (2006.01) | |
| *H01L 41/37* | (2013.01) | |
| *C08L 71/02* | (2006.01) | |
| *C08G 69/48* | (2006.01) | |
| *H01L 41/18* | (2006.01) | |
| *H01L 41/113* | (2006.01) | |

(52) U.S. Cl.
CPC .............. *H01L 41/183* (2013.01); *B82Y 30/00* (2013.01); *C08L 77/06* (2013.01); *H01L 41/1136* (2013.01); *C08G 69/28* (2013.01); *H01L 41/37* (2013.01); *C08G 2261/126* (2013.01); *H01L 41/193* (2013.01); *C08L 71/02* (2013.01); *C08G 69/48* (2013.01); *Y10S 977/724* (2013.01); *Y10S 977/783* (2013.01); *Y10S 977/902* (2013.01); *Y10S 977/932* (2013.01)
USPC ............ 525/88; 525/92 B; 525/418; 525/420; 525/540; 977/724; 977/783; 977/902; 977/932

(58) Field of Classification Search
USPC ......... 525/418, 451, 474, 539, 540, 88, 92 B, 525/420; 977/724, 783, 902, 932
See application file for complete search history.

(56) References Cited

U.S. PATENT DOCUMENTS

2010/0052196 A1 *  3/2010  Yasuda et al. ................ 264/1.34

OTHER PUBLICATIONS

Menzel et al., Polymer Bulletin, 27, 637-644 (1992)).*

* cited by examiner

*Primary Examiner* — Jeffrey Mullis
(74) *Attorney, Agent, or Firm* — Schwegman Lundberg & Woessner, P.A.

(57) ABSTRACT

This disclosure discloses novel responsive polymers that comprise a rod segment and (or) a coil segment. This disclosure also discloses nanomaterial-polymer composite comprising the responsive polymers that are covalently linked with nanomaterials. Also disclosed are polymeric transducer materials and sensor systems that comprise the nanomaterial-polymer composite.

15 Claims, 19 Drawing Sheets

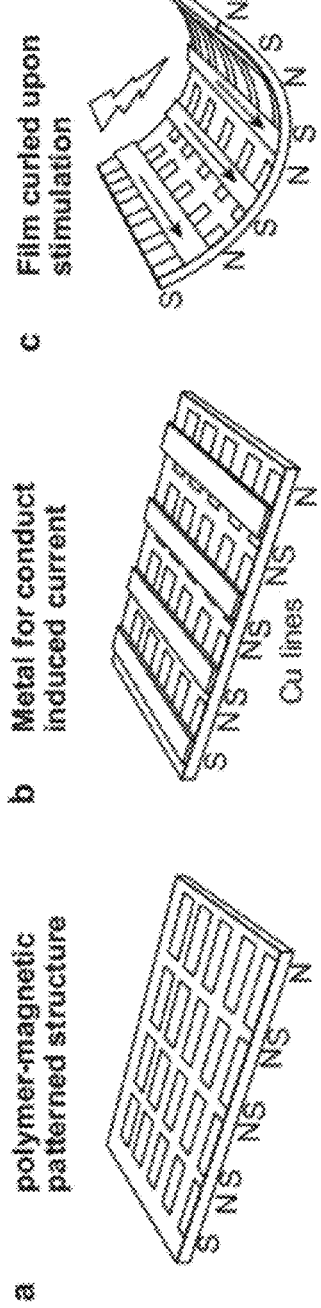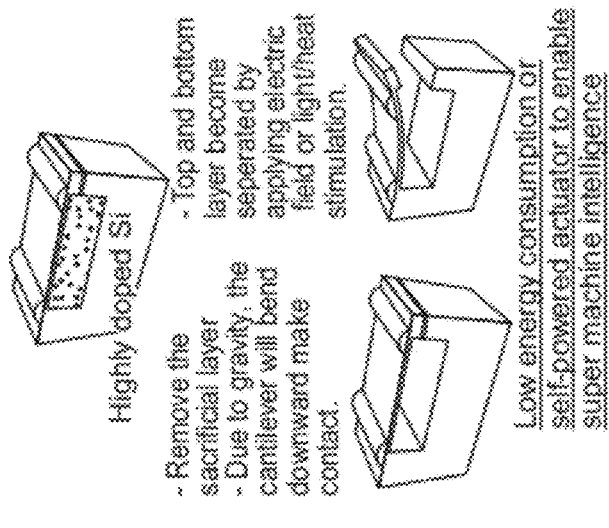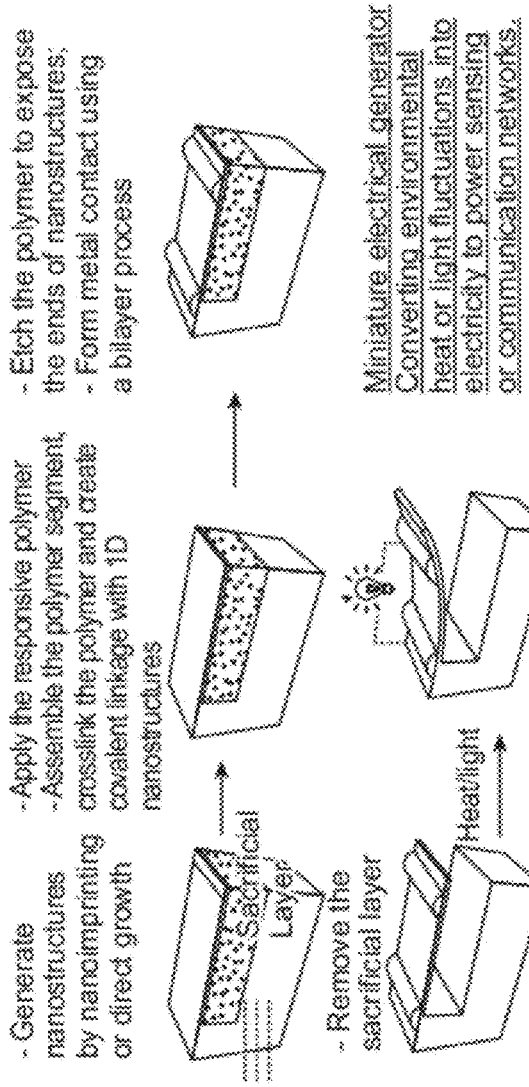
FIG. 14
FIG. 15

RESPONSIVE POLYMER SYSTEM AND NANOHYBRID THIN FILMS

CROSS REFERENCE TO RELATED APPLICATION

This application claims the benefit under 35 U.S.C. §119(e) of U.S. Provisional Ser. Nos. 61/349,797, filed May 28, 2010 and 61/350,823, filed Jun. 2, 2010, the contents of each of which is incorporated by reference in its entirety into the present disclosure.

FIELD OF THE INVENTION

This invention relates to the field of transducer materials incorporating nanomaterials (1D nanostructures) and responsive polymers, and to the use of these transducer materials in sensing, amplifying and converting ambient energy such as light and heat into macroscopically detectable forms for signal processing, modulation and energy conversion.

BACKGROUND

Throughout this disclosure, various publications, patents and published patent specifications are referenced by author and/or by citation. The disclosures of all publications, patents and published patent specifications are hereby incorporated by reference into the present disclosure to more fully describe the state of the art to which this invention pertains.

Technological advancement demands new types of transducer materials that can efficiently sense and convert force and energy from one type to another for signal processing and modulation, switching and actuation, sensing and energy harvesting. Additional desirable features include the ability to mimic the hearing system where deformation of cylindrical stereocilia cells in response, to sound pressure in the cochlea of the inner ear is converted into electrical signals to excite the auditory nerve. Similarly, it can imitate the vision system where shape change due to photoisomerization of rhodopsin molecules in rod and cone shaped cells in retina upon light irradiation will induce a change of electrical current to excite the optic nerve.

New transducer materials are essential for science and technology advancement. For example, being able to convert solar energy into electrical energy provides the potential for green energy harvesting, harness vibrational energy to power sensing network and medical implants (Wang et al., "Piezoelectric nanogenerators for self-powered nanodevices", IEEE Pervas Comput 2008, 7 (1), 49-55; Op het Veld et al., "Harvesting mechanical energy for ambient intelligent devices", Inform. Syst. Front. 2009, 11 (1):7-18; Paradiso and Starner "Energy scavenging for mobile and wireless electronics", IEEE Pervas Comput 2005, 4 (1):18-27) and new adaptive and autonomous materials for space mirror and unmanned aerial vehicles.

Current transducer materials in general suffer from one or more of the following shortcomings: (i) complex and bulky architectures; (ii) high power consumption and low coupling efficiency; (iii) slow response; (iv) limited bandwidth; (v) poor reliability caused by hysteresis and fatigue and (vi) sensitivity limited to one type of stimuli.

Nanocomposite materials with combined best properties of two distinct materials could provide the necessary advantages. In spite of enormous research activities, the technology and science of nanocomposites are still in their infancy. This is largely due to the lack of ability of synthesizing nanocomposites with controlled morphology and interface characteristics. The persistent challenges include poor dispersion and interfacial strength. The best reported Young modulus of CNT composites to-date is only 10% of what was predicted (Huynh et al., Science 2002, 295, 2425-2427; Law et al., Nature Materials 2005, 4, 455-459). Therefore, to capitalize unique nanomaterial properties, not only is a new processing and fabrication strategy required but also the interface needs to be reinforced for effective load and energy transfer.

ZnO nanowires have shown the ability to harvest low-frequency vibrational energy and therefore is one nanocomposite material that has been studied (Xu et al. (2010) Nature Nanotechnology 5:366-373). However, only less than 1.0% of mechanical energy was converted into electricity. This exemplifies the importance of a cohesive interface which is capable of efficiently transferring energy across the boundary to minimize loss. It also indicates that a system that contains a large number of nanostructures acting constructively is needed to produce sufficient signal strength for real-world applications.

To summarize, the field of nanocomposites is largely unexplored but offers great technological promise. Inability to control density, location and orientation of functional nanowires have hampered the advanced of nanocomposites-based science and technology. To the best of Applicants' knowledge, no materials that combine high deformable nature of polymers with other materials to create new light-weight and energy efficient actuators which can create amplified motion and miniature energy harvesting devices that can convert various ambient energies into electricity have been reported. This invention reports such a material and its multifunctional use.

SUMMARY

Polymeric composites have achieved great commercial success in coatings, cosmetics, packaging and automobiles. With the inception of Applicants' nanomaterials, for the first time, there are opportunities to design materials without the compromises typically found in conventional composites. Potential applications range from energy saving, energy harvesting, aerospace, automotive and electronics to biotechnology. (See, e.g., Huynh, et al. (2002) Science 295:2425-2427; Law, M. et al. (2005) Nature Materials 4: 455-459; Shen, L. H. et al. (2008) Journal of Alloys and Compounds 465:562-566; Zhao, Q. et al. (2205) Applied Physics Letters 86:193101-193103; Tang, Y. B. et al. (2005) Chemical Physics Letters 416:171-175; Yang, J. et al. (2006) Nanotechnology 17: S321-S326; Moniruzzaman, M. and Winey, K. I. (2006) Macromolecules 39: 5194-5205; Paul, D. R. and Robeson, L. M. (2008) Polymer 49: 3187-3204; Vaia, R. A. and Maguire, J. F. (2007) Chemistry of Materials 19: 2736-2751; and Vaia, R. A. and Giannelis, E. P. (2001) Mrs Bulletin 26:394-401.)

To this end, this disclosure provides materials, methods and the application of a new transducer platform comprising two components: new responsive polymer which will deform readily upon light and/or heat stimulations and 1D functional nanomaterials such as piezoelectrical materials. By harnessing complimentary properties offered by these two distinct materials and exploiting the increasingly dominant role of interfaces, a new type of hybrid transducer materials are created.

This disclosure provides 1D nanostructures that are directly synthesized and fabricated on MEM-based device platforms. The new polymer system can also be processed and integrated into these devices.

In one aspect, this disclosure provides a new type of multi-block copolymer system that comprises, or alternatively consists essentially of or yet further consists of, a "rod-like" polyamide segment which is covalently linked to a "coil-like" segment. To beget thermal sensitivity, the "coil-like" segment comprises, or alternatively consists essentially of, or yet further consists of, a material with a melting temperature designed to be near the operation temperature so that it curls and straightens in response to heat fluctuations, acting as a thermal switch as illustrated in FIG. 1a. To render it light responsive, a number of azobenzene groups, acting as light switches, can be incorporated in the "rod-like" segment. The melting temperature of coil-like segment can be tuned to below the operation temperature by using different types of polymers such as polysiloxane or low molecular weight polyethylene oxide.

Crosslink density within the polymer can be adjusted by varying the number of benzocyclobutane and vinyl group incorporated in the polymer chain, e.g., from about 20% to about 100% of the available groups. In one aspect, the number of groups is about 50%. The connectivity between polymer and 1D nanomaterials can be tailored independently by the number of benzocyclobutene on the polymer and number of vinyl groups on the 1D nanomaterials, e.g., from about 0% to about 100%.

The organizational forces (dipole-dipole, van der Waals and π-π stacking) coerce polymer chains to form highly ordered morphology as shown in FIG. 1b. The collective action of a group of molecular switches in hierarchical domains and nanoscale "nunchaku effect" will enable an "amplified morphing" to slight changes in their surrounding media such as visible light and room-temperature heat fluctuations. The intermolecular connectivity between polymer chains described in FIG. 1b are established by thermal crosslinking between vinyl groups and benzocyclobutene groups which are incorporated in the rod segment for improving mechanical integrity and increasing duty cycle as well as faster response and recovery. A built-in crosslinking moiety, e.g., benzocyclobutene (BCB) groups on the rod segment, reacts with double bonds decorated on functional nanostructures after surface modification to create covalent linkages (depicted in FIG. 2b) thus effectively amalgamating two dissimilar materials together. Not only does the system change volume under light and external, i.e., thermal variations, but the system also responds rapidly with a frequency similar to biological systems and state-of-the-art polymeric materials. See, e.g., White et al. (2009) J Mater Chem. 19(8):1080-1085. More prominently, the polymer film can expand and contract using less than 5% of the typical light intensity value reported for other azobenzene-based polymer systems (White et al., supra.; Kondo et al, (2006) Angew Chem Int Edit 45(9): 1378-1382; Barrett et al. (2007) Soft Mater 3(10):1249-1261; Koerner et al. (2008) Matter Today 11(7-8):34-42; Yu et al. (2004) Chem Mater 16 (9):1637-1643; Camacho-Lopez et al. (2004) Nat Mater 3(5): 307-310).

The disclosure also provides a device comprising Applicants' novel polymer and nanomaterials. Nanomaterials such as carbon nanotubes (CNTs), nanowires, nanobelts, and piezoelectric nanowires (comprised of, or alternatively consisting essentially of, or yet further consisting of any one or more of ZnO AlN, InN, perovskite, structure, $BaTiO_3$, $PbTiO_3$ and ferromagnetic materials such as NiFe) exhibit unique properties. They are elastic with higher Young's modulus than polymer but less than their macroscopic counterparts. Applicants couple the nanomaterials with the inventive polymer to create a new class of nanohybrids that have greatly enhanced and new transduction properties.

For example, nanomaterials such as CNTs which have excellent mechanical properties are provided to facilitate fast switching. Furthermore, exploiting an increasingly dominant role of interfaces through inventive interface engineering, the force and energy can effectively transferred back and forth and hysteresis and fatigue commonly affiliated with polymeric materials can be eliminated. Device reliability therefore is improved significantly. Additionally, infrared photons absorbed by CNTs (as an example) can raise the internal temperature and CNTs thus can act as a heat source to facilitate generation of strain energy produced by the new responsive polymer, generated by azobenzene isomerization as an example, further accelerating recovery time (Koerner et al. (2004) Nat Mater 3(2): 115-120; Yang et al. (2008) Adv Mater 20(12):2271-2275).

Dynamic force and energy transfer is achieved by appropriate connectivity or the extent of linkage between ID nanostructures and the responsive polymer.

The synergistic dynamic interaction between the two dissimilar materials (i.e., the novel polymer system and nanomaterial) enables the manufacture of revolutionary systems and devices. The new composite materials also possess new functionalities otherwise unattainable. For example, when the nanomaterial comprises piezoelectric nanomaterials, strain energy generated by light and heat is transferred and photon and phonon energy is converted for energy harvesting rather than being wasted. In another embodiment using a CNT-based nanomaterial in the composite, one can manufacture a light driven miniature actuator with amplified motion.

The new composite materials further provide enhanced performance and/or new functionalities.

Incorporation of the polymer with loss into ferroelectric materials, will increase electromechanical coupling efficiency, leading to higher energy conversion from mechanical to electrical energy.

This new system also provides a platform for technological innovations. New wireless and optically driven micro pumps and optically modulated active optical components, advanced sensing systems and self-powered glucose sensors, just to name a few, can be generated and are within the scope of the Application. Applications include movement maneuvering, energy harvesting, health monitoring, motion and environmental sensing, medical imaging, powering unmanned aerial vehicles as an example. It can be further extended to life science, e.g., dynamic scaffolds for tissue engineering and powering and maintaining medical implants (heart valves and self-powered orthopedic knee implant) and beyond. Advancement of actuator and sensor technology is expected to be benefited greatly from this work.

Applicants achieve these results as described herein. Thus, in one aspect, this disclosure provides a responsive polymer comprising, or alternatively consisting essentially of, or yet further consisting of a rod segment that deforms upon light stimulation and/or a coil segment that deforms upon thermal stimulation, wherein the rod segment and the coil segment are covalent attached to each other. In another embodiment, provided is a responsive polymer comprising a rod segment that deforms upon light stimulation and a coil segment that is not sensitive to external stimulation. In another embodiment, provided is a responsive polymer comprising a rod segment without light switches and a coil segment that is not sensitive to external stimulation. A non-limiting example of external stimulation is thermal energy such as sunlight.

In one aspect of the above embodiments, the rod segment comprises polyamides. Non-limiting examples of such comprise, or alternatively consist essentially of, or yet further consist of, one or more of the group of azobenzene groups, benzocyclobutane, acrylate, styrene, or a combination thereof. In a further aspect, the polyamides further comprise, or alternatively consist essentially of, or yet further consist of, one or more azobenzene groups. In another aspect, the polyamides further comprise, or alternatively consist essentially of or yet further consist of, one or more of the group of benzocyclobutane, acrylate, or styrene, or a combination thereof.

Non-limiting examples of the coil segment comprises, or alternatively consist essentially of, or yet further consist of, at least one of polyether or polysiloxane, or a combination thereof. In one embodiment, the polyether comprises polyethylene glycol or polysiloxan based low Tg materials, examples of which include a polyethylene glycol is of molecular weight between 300 g/mol to 5,000 gm/mol.

In another aspect, the polyethylene glycol is selected from PEG 600, PEG 1000, PEG 1500, PEG 2000, and PEG 4000.

In another aspect, the rod segment further comprises, or alternatively consist essentially of, or yet further consist of, bezocyclobutane groups.

The polymer may additionally comprise surface modifiers such as a diblock polymer or small molecule that comprise two reactive segments with or without a spacer. For example, the vinyl-containing segment can form covalent linkages with benzocyclobutene groups on polymer chains by Diel-Alder reaction while the other segment is chosen to form strong bonding with 1D nanomaterials.

This disclosure also provides a process for making a responsive polymer by a method comprising, or alternatively consisting essentially of, or yet further consisting of:
(a) coupling a diamine with a dicarboxylic acid dihalide to provide a rod segment comprising, or alternatively consisting essentially of, or yet further consisting of, a polyamide comprising azobenzene groups;
(b) coupling the product of step (a) with a dicarboxylic acid dihalide comprising or alternatively consisting essentially of, or yet further consisting of, a polyether, a polysiloxane, or a combination thereof; and
(c) coupling the product of step (b) with a diamine to provide the responsive polymer as described herein.

In one aspect, the diacarboxylic acid dihalide in steps (a) and (b) is a diacarboxylic acid dichloride. In another aspect, the coupling of steps (a) to (c) is carried out in a one or more solvent selected from N-methylpyrrolidone (NMP), N,N-dimethylacetamide, N-methyl piperidine, N,N-dimethylformamide, dimethyl sulfoxide, or a combination thereof. In a further aspect, step (a) is performed by cycloaddition and/or Diel-Alder reaction.

Applicants have found that there is very low shrinkage associated with cycloaddition reaction between the polymer matrix and 1D nanomaterials thus forming covalent linkages between the surface modifier and polymer without minimum residue stress.

A responsive polymer made by this process is further provided herein.

Also provided by this disclosure is a nanomaterial polymer composite material comprising or alternatively consisting essentially of, or yet further consisting of, a nanomaterial covalently attached to a matrix comprising the responsive polymer as described herein, wherein the nanomaterial is substantially parallel to each other and are covalently linked to the responsive polymer.

Thus, in another aspect, this disclosure provides responsive polymer of the composite comprising, or alternatively consisting essentially of, or yet further consisting of a rod segment that deforms upon light stimulation and a coil segment that deforms upon thermal stimulation, wherein the rod segment and the coil segment are covalent attached to each other.

In one aspect of the above embodiments, the rod segment comprises polyamides. Non-limiting examples of such comprise, or alternatively consist essentially of, or yet further consist of, one or more of the group of azobenzene groups, benzocyclobutane, acrylate, styrene, or a combination thereof. In a further aspect, the polyamides further comprise, or alternatively consist essentially of, or yet further consist of, one or more azobenzene groups. In another aspect, the polyamides further comprise, or alternatively consist essentially of, or yet further consist of, one or more of the group of benzocyclobutane, acrylate, or styrene, or a combination thereof.

Non-limiting examples of the coil segment comprises, or alternatively consist essentially of, or yet further consist of, at least one of polyether or polysiloxane, or a combination thereof. In one embodiment, the polyether comprises polyethylene glycol or polysiloxan based low Tg materials, examples of which include a polyethylene glycol is of molecular weight between 300 g/mol to 5,000 gm/mol.

In another aspect, the polyethylene glycol is selected from PEG 600, PEG 1000, PEG 1500, PEG 2000, and PEG 4000.

In another aspect, the rod segment further comprises, or alternatively consist essentially of, or yet further consist of, bezocyclobutane groups.

Further provided is a method of making a nanomaterial polymer composite material comprising, or alternatively consisting essentially of, or yet consisting of,
(a) depositing a responsive polymer as described above on a plurality of a nanomaterial; and
(b) curing to provide the nanomaterial polymer composite material.

In one aspect, the responsive polymer comprises, or alternatively consists of, or yet further consists of at least one of a benzocyclobutane and a vinyl group, or a combination thereof.

In a further aspect, the method further comprises, or alternatively consists of, or yet further consists of removal of a sacrificial underlayer to provide a suspended nanotube polymer composite material.

The nanotube polymer composite material comprises, or alternatively consists of, or yet further consists of, 1D piezoelectric nanomaterial covalently linked to the responsive polymer.

In another aspect, the nanomaterial is covalently linked to the responsive polymer via cycloaddition of benzocyclobutane or vinyl groups in the responsive polymer with double bonds of nanotube.

Further provided is a transducer system comprising at least one 1D nanomaterial comprising a plurality or array of substantially aligned nanomaterial covalently attached to a responsive polymer as described above. In one aspect, the system further comprises, or alternatively consists of, or yet further consists of, or alternatively consists of, or yet further consists of:
(a) a first electrode attached to the transducer and
(b) a second electrode attached to the transducer.

In another aspect, the nanomaterial or the system further comprises a means for partially shielding the nanomaterial from one or more external stimulus such as mechanical stress, heat or light.

Also provided is a method for generating an electrical current comprising, or alternatively consisting essentially of, or yet further consists of, placing a mechanical stress on the transducer described above, thereby generating the current.

Yet further provided is a method for generating an electrical current comprising, or alternatively consisting essentially of, or yet further consists of, exposing the nanomaterial to heat and/or light, thereby generating the current.

This disclosure also provides a method to generate amplified motions by applying current to a system or composite material described above such that mechanical stress is generated on the nanomaterial and then transfer unto the polymer. Alternatively, external perturbations can induce the change of electric current or voltage which can be used as environmental sensors.

BRIEF DESCRIPTION OF THE DRAWINGS

FIG. 1a is a conceptual drawing of a new responsive polymer structure and its shape changing upon stimulation.

FIG. 1b conceptually shows crosslinking between polymer chains (top) and between polymer chain and inorganic materials by cycloaddition (bottom).

FIG. 2a illustrates functional components in the new responsive polymer system.

FIG. 2b illustrates self-assembled rod and coil segments after thermal crosslinking (there are around 8 or greater than 8 azobenzene molecules in each rod segment but only 2 are drawn here for simple illustration).

FIG. 3a2 illustrates synthetic scheme for preparation of aromatic polyamide 4 without azobenzene.

FIG. 10a1 illustrates a direct crosslinking between CNTs and BCB-containing responsive copolymer.

FIG. 10a2 illustrates polybutadiene-b-poly(4-vinylpyridine) modified ZnO piezoelectric nanowires after thermal reaction, covalently linked to BCB-containing responsive polymer.

FIG. 10b illustrates chemical reaction schemes of BCB with double bonds and between BCBs.

FIG. 14, panels a-c illustrate illustrates a deformable ferromagnetic-polymer thin film composites.

FIG. 15 illustrates responsive piezoelectric-polymer suspended thin film composites with electrodes on sides.

DETAILED DESCRIPTION

Figure 1:
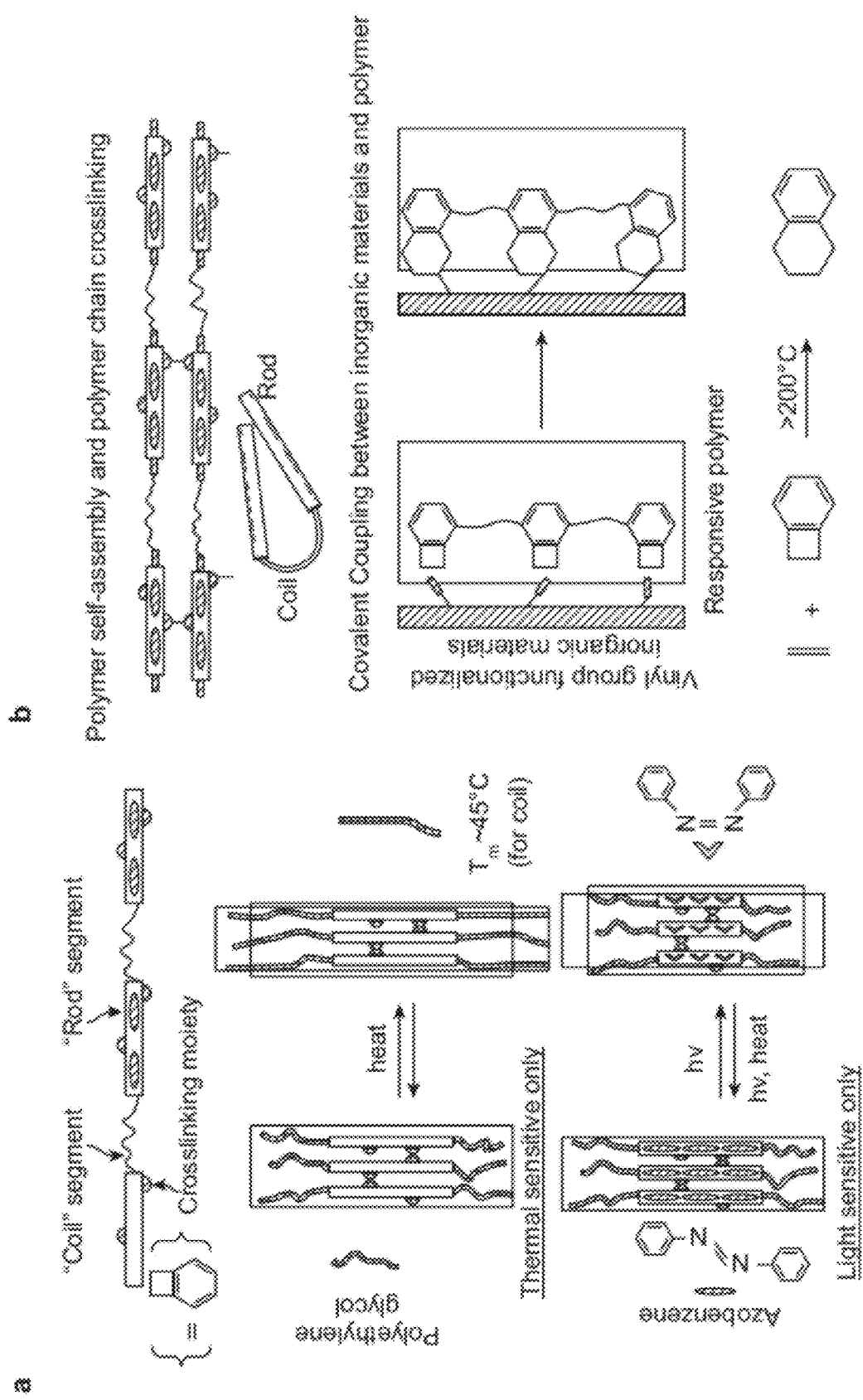
FIG. 3a1 illustrates synthetic scheme for preparation of aromatic polyamide 1 with azobenzene.

All numerical designations, e.g., pH, temperature, time, concentration, and molecular weight, including ranges, are approximations which are varied (+) or (−) by increments of 0.1. It is to be understood, although not always explicitly stated that all numerical designations are preceded by the term "about". The term "about" also includes the exact value "X" in addition to minor increments of "X" such as "X+/−0.1" or "X+/−1.0" as appropriate. It should be understood, although not always explicitly stated, that the reagents described herein are merely exemplary and that equivalents of such are known in the art.

DEFINITIONS

As used herein, certain terms may have the following defined meanings.

As used in the specification and claims, the singular form "a," "an" and "the" include singular and plural references unless the context clearly dictates otherwise. For example, the term "a carbon nanotube" includes a single carbon nanotube and as well as a plurality of carbon nanotubes.

As used herein, the term "comprising" is intended to mean that the compositions and methods include the recited elements, but do not exclude others. "Consisting essentially of" when used to define compositions and methods, shall mean excluding other elements of any essential significance to the combination when used for the intended purpose. Thus, a composition consisting essentially of the elements as defined herein would not exclude trace contaminants or inert carriers. "Consisting of" shall mean, e.g., excluding more than trace elements of other ingredients and substantial method steps for preparing the material and/or the molecular sensor. Embodiments defined by each of these transition terms are within the scope of this disclosure. Accordingly, it is intended that the methods and compositions can include additional steps and components (comprising) or alternatively including the steps and compositions of no significance (consisting essentially of) or alternatively, intending only the stated methods steps or compositions (consisting of).

As used herein a "nanomaterials" intends any nanostructure, e.g., single, double and multi-walled CNTs, piezoelectric 1D nanomaterials, 1D nanotubes, 3D nanotubes, nanowires, nanorods, nanobelts and suspended nanotubes and suspended nanowires which in one aspect, can be further surface modified. The diameter of the nanomaterials is in the range of about 0.5 nm to about 1000 nm, or alternatively less than about 750 nm, or alternatively less than 500 nm, or alternatively less than about 400, or alternatively less than 300, or alternatively less than 250 nm, or alternatively less than 200 nm, or alternatively less than 150 nm. In one aspect, the nanomaterials have an diameter of less than about 100 nm, or alternatively, less than about 50 nm, or alternatively, less than about 25 nm, or alternatively, less than about 10 nm, or alternatively, less than about 2 nm, or alternatively, less than about 1.8 nm, or alternatively, less than about 1.6 nm, or alternatively, less than about 1.4 nm, or alternatively, less than about 1.2 nm, or alternatively, less than about 1.0 nm, or alternatively, less than about 0.8 nm. Alternatively, the nanomaterials have a general diameter from about 0.5 nm to about 1000 nm, alternatively from about 0.5 nm to about 500 nm; alternatively from about 0.5 nm to about 100 nm, alternatively from about 0.5 nm to about 50 nm and alternatively from about 0.5 nm to about 10 nm. In a preferred embodiment, the nanomaterials have a general diameter from about 0.5 nm to about 2 nm. The nanomaterials can comprise any suitable material. Non-limiting examples include zinc, gallium, cadmium, copper, titanium, indium, calcium, gold, magnesium, iron, indium, silicon, vanadium, carbon, boron, bismuth, germanium, and mixtures thereof.

As used herein the term "nanotube" is intend to mean a cylindrical tubular structure of which the most inner diameter size lies between 0.5 nm and 1000 nm and intervening diameters as disclosed above, typically having an aspect ratio over 500. In one embodiment, the nanotubes are carbon nanotubes (CNTs), e.g., single, double or multi-walled CNTs nanotubes. A nanotube is a member of the fullerene structural family, which also includes buckyballs. Whereas buckyballs are spherical in shape, a nanotube is cylindrical, with at least one end typically capped with a hemisphere of the buckyball structure. Nanotubes are composed primarily or entirely of $sp^2$ bonds, similar to those of graphite. This bonding structure, stronger than the $sp^3$ bonds found in diamond, provides the molecules with their unique strength. Single-walled CNTs (SWCNT) or multi-walled CNTs (MWCNTs) are examples of well-studied CNT structures.

As used herein the term "suspended nanostructures" is intend to mean a 1D nanostructure suspended.

As used herein, the term "nanowire" is intended to mean a wire of hollow diameter of the order of a nanometer ($10^{-9}$ meters), which the most inner diameter size lies between 0.5 nm and 1000 nm and intervening diameters as disclosed above. Alternatively, nanowires can be defined as structures that have a lateral size constrained to tens of nanometers or less and an unconstrained longitudinal size. At these scales, quantum mechanical effects are important, therefore such wires are also referred to as "quantum wires". Many different types of nanowires exist, including metallic (e.g., Ni, Pt, Au), semiconducting (e.g., Si, InP, GaN, etc.), and insulating (e.g., $SiO_2$, $TiO_2$).

As used herein, the term "nanorod" includes solid nanowires and solid nanorods and refers to a nanoscale object, including, having dimensions in the range of from about 1 nanometer to about 100 nanometers. In one aspect, the nanorod have an diameter of less than about 100 nm, or alternatively, less than about 50 nm, or alternatively, less than about 25 nm, or alternatively, less than about 10 nm, or alternatively, less than about 2 nm, or alternatively, less than about 1.8 nm, or alternatively, less than about 1.6 nm, or alternatively, less than about 1.4 nm, or alternatively, less than about 1.2 nm. Alternatively, the nanomaterials have a general diameter from about 0.5 nm to about 1000 nm, alternatively from about 0.5 nm to about 500 nm; alternatively from about 0.5 nm to about 100 nm, alternatively from about 0.5 nm to about 50 nm and alternatively from about 0.5 nm to about 10 nm. In a preferred embodiment, the nanomaterials have a general diameter from about 0.5 nm to about 2 nm.

A "nanobelt" is a nanowire or nanorod having two dimensions—with one dimension significantly greater than the other, similar to a "belt."

Nanowire, nanotubes and nanorods are functional material, 1D electronic, 1D ferroelectric, 1D piezoelectrical, 1D ferromagnetic transducer materials. For examples, a "piezoelectric" nanomaterial intends a material that converts mechanical energy into electrical energy. (See, e.g., Yang et al. (2009) Nano Letters 9(3):1201-1205 and Yang et al. (2009) Nat. Nanotech. 4:34-39.)

The term "solid support" is intended to mean (i) a catalyst-containing template deposited on which 1D nanostructures will be formed. The solid support can comprise in whole or in part of a material, such as silicon, that is either non-conductive or can be otherwise converted into a non-conductive material. For example, the solid base can comprise silicon, wherein thermal deposition of silicon oxide gives a non-conductive surface. Other materials which can be used include, for example, silicon, glass, quartz, sapphire, germanium, gallium arsenide, $SiO_2$, Si3N4, polymer, indium phosphide or plastic. There is no preferred dimension to the solid support, although they can be as small as less than 5 $\mu m^2$ or less than 4 $\mu m^2$, or less than 3 $\mu m^2$, or less than 2 or less than 1 or between 0.5 $\mu m^2$ and 5 $\mu m^2$ and increments in between.

The terms "catalyst" and "catalyst-particle" are used interchangeably and are intended to refer to a carbon-nanotube-growth-promoting or nucleating-catalyst, such as those containing iron, cobalt, or any other suitable 1D nanomaterial-growth-promoting or nucleating-catalyst or mixture thereof. The size of the catalyst-particles on the "solid support" control the diameter of the suspended 1D nanostructure. The synthesis on such support structures that can be used in the present disclosure include, but are not limited to those which are known in the art (Lu, et al. (2006) J. Phys. Chem. B. 110:10585-10589; Cassell, et al. (1999) J. Am. Chem. Soc. 121: 7975-7976). The suspended 1D nanostructure synthesized on the support structures of the disclosed disclosure are to be differentiated from the vertically aligned or bundled nanotubes known in the art (Zhao, et al. US Pub. No. US 2006/0252065, filed Mar. 5, 2006).

The term "oriented" is intended to refer to a suspended 1D nanostructure or a series of 1D nanostructures that grow outwardly toward an adjacent surface or wall wherein the 1D nanostructure will be suspended across an indentation. Whereas a well shaped indentation would generate a high population of suspended 1D nanostructures with a lot of crossovers, a trench shape indentation may result in less crossover. In another instance, 1D nanostructures are grown perpendicularly, pseudo-expitally on a surface to form vertically aligned suspended structures.

As used herein, the term "surface-modifier" is intend to mean modifying any surface of 1D nanostructures with reactive sites such as vinyl groups, but is not limited to, more than a simple application or layering on the surface. For example, surface modification may comprise functional attachment to the surface of 1D nanostructures by Van der Waals forces, ionic bonds, coordination binds, covalent bonds, hydrogen bonds, or any other chemical bonds or methods. The modifications may or may not be permanent and in some cases may be reversible.

As used herein, the term "transducer" is intended to mean a species that converts a signal from one form to another to allow for signal detection. For example, an "environmental perturbation" such as change in temperature, pressure, vibration, or current or, causes a detectable signal change in the transducer. As used herein, the term "environmental perturbation" is intend to mean a variable change in the local environment (light, temperature, mechanical vibration) of the transducer, A "sensor system" is a system that will change upon natural or artificial stimulation, e.g., environmental such as temperature, pressure, electrical.

An "electrode" intends a conductive material that is used to make a contact with a non-metallic part of a circuit such as a semiconductor, an electrolyte or a vacuum. Conductive materials include, but are not limited to metallic conductors such as gold, palladium, platinum, molybdenum, titanium, copper, silver, lead, zinc or aluminum and non-metallic substances such as carbon.

Responsive Polymers of the Disclosure

Some polymeric materials can undergo considerable shape and volume change upon external stimulation. Exposure to heat, electrical field or light can induce changes as manifested by bending and uniaxial expansion and contraction (Shahinpoor et al., "Artificial Muscles: Applications of Advanced Polymeric Nanocomposites", Taylor and Francis: New York, 2007; Anquetil et al., "Handbook of Organic Electronics and Photonic", American Scientific: Los Angeles, 2007, 447-483; Pelrine et al., "High-speed electrically actuated elastomers with strain greater than 100%", Science 2000, 287 (5454), 836-839; Osada and Matsuda (1995) Nature 376:(6537):219; Wang et al., (1997) Polym Advan Technol 8(3):136-139; Luo et al., (1997) J. Appl. Polym. Sci. 64:2433-2440; Hang and Zhang (1999) J Polym Sci B: Polym Phys. 37:101-112; Lendlein and Kelch (2002) Angew Chem Int Edit 41(12): 2034-2057; Bar-Cohen Y. (Ed) "Electroactive Polymer (EAP) Actuators as Artificial Muscles-Reality, Potential, and Challenges", SPIE Press: Bellingham, Wash., USA, 2004; Christopherson and Smela "Polypyrrole-gold bilayer microactuators; response time and temperature effects", Smart Structures and Materials, Electoactive Polymer Actuators and Devices (EAPAD), San Diego, Calif., USA, 2006; Zhou et al. (2004) IEEE-Asme T Mech. 9(2):334-342; Wang et al., (2004) Adv Mater 16(18):1605-1609; Nagai et al., (1999) J Polym Sci B: Polym Phys 37:2549-2550; Bailey et al., (1985) J Guid Control Dynam 8(5):605-611). Such polymeric responsive materials have been proposed for various applications ranging from artificial muscles, tissue scaffolds, micromechanical systems and lab-on-a-chip devices. However, the lack of commercial success is due to (i) slow response and recovery time; (ii) insufficient mechanical durability resulting from fatigue and hysteresis; and (iii) lack of integration strategies, (iv) inability to form strong interface with inorganic materials (van Oosten et al., (2009) Nat Mater 8(8):677-682). To the best of Applicants' knowledge, this disclosure provides a brand new type of polymer system containing either light and/or thermal molecular switches or both which can deform rapidly and dramatically by slight changes in light and thermal energy. Furthermore, benzocyclobutane (BCB) functional groups incorporated onto the polymer main chains that thermally react with double bonds found on 1D nanomaterial surfaces provide covalent connectivity between the polymer and 1D nanomaterials. Double bonds can be found on ID nanomaterials such as CNTs (contains strained double bonds) or after functionalization using vinyl-containing block copolymer macromolecules. Very low shrinkage is associated with such BCB ring opening reactions, yielding low-stress films with excellent mechanical and chemical integrity. In addition, vinyl group can be also "dialed in" the responsive polymer thus the degree of crosslink of the polymer and subsequent mechanical properties can be tuned.

Thus, in one aspect, this disclosure provides a new type of a multiblock copolymer having both rod (rod/inflexible) and coil (coil/flexible) moieties. FIG. 2a is a representation of active components in this new responsive polymer system and the deformation mechanisms by thermal or light excitation. Without being bound by theory, this polymer includes a rod, "rod-like" aromatic polyamide segment that contains a number of azobenzene groups, a series of light switches which deform under light stimulation and a coil, "coil-like" segment such as a polyether, for example, polyethylene glycol (PEG), with low melting temperature. If the coil like segment is designed with the melting temperature around room temperature, the polymer will curl and straighten in response to heat fluctuation, creating a thermal switch. The organizational force created by the dissimilar blocks, geometric constraints imposed by the rod segment and intramolecular connectivity induce macromolecules to form ordered morphology. The collective actions of a large number of molecular switches within hierarchical domains and nanoscale "nunchaku effect" enable this new material system to deform profoundly in response to slight changes in their surrounding media, visible light and room-temperature heat fluctuation. The PEG component as example is responsible for thermal deformation while azobenzene groups in the "rod" segment can deform upon light stimulation. Therefore the material can be both light and heat sensitive. After annealing the polymer film, phase separation is observed between these two dissimilar segments under a polarized microscope. The BCB or the group on the vinyl polymer dimerization at 350-360° C. or react with double bonds around 250° C. respectively is carried out to crosslink the polymer for improving film elasticity and overall mechanical integrity as depicted in FIG. 2b. 1-30 micron thick suspended films are routinely produced.

Thus, in one embodiment, this disclosure provides a responsive polymer comprising a rod segment that deforms upon light stimulation and a coil segment that deforms upon thermal stimulation. In another embodiment, a responsive polymer comprising a rod segment that deforms upon light stimulation and a coil segment that is not sensitive to external stimulation. In another embodiment, a responsive polymer comprising a rod segment without light switches and a coil segment that is not sensitive to external stimulation. In one aspect, the rod segment comprises polyamides. In another embodiment, the polyamides comprise azobenzene groups. In a further embodiment, the polyamides comprise benzocyclobutane, or double bond modified terephthaloyl or a combination thereof. In a yet further aspect, the rod segment is a polyamide comprising, or alternatively consisting essentially of, or yet further consisting of, azobenzene groups and benzocyclobutane groups.

Non-limiting examples of the coil segment comprise, or alternatively consist of, or yet further consist essentially of, at least one of a polyether and a polysiloxane, or a combination thereof.

In one embodiment, the coil segment comprises or alternatively consist of, or yet further consist essentially of, a polysiloxane. Polysiloxanes are polymers with the structure $R(R_2SiO)_nSiR$ in which the chain contains alternate silicon and oxygen atoms, wherein n=10 to 200, or alternatively between 20 and 200. In a one aspect, n is 20. Typically, R is H, or an aromatic group such as benzene or toluene group. In one aspect, R is straight chain unsubstituted lower alkyl ($C_1$-$C_4$), $C_2$, or $C_3$ e.g., methyl. $R_2$ can be alkyl group such as methyl, ethyl, propyl with or without double bond linked to R. Specific embodiments of the above include without limitation:

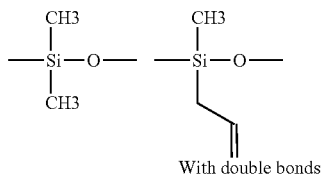

With double bonds

In another embodiment, the coil segment comprises a polyether. In another embodiment, the coil segment comprises polyethylene glycol (PEG). For the purpose of illustration only, the polyethylene glycol is of molecular weight in a range of about 300 g/mol to about 5,000 gm/mol, or alternatively of about 400 g/mol to about 4,500 gm/mol, or alternatively of about 500 g/mol to about 4,000 gm/mol, or alternatively of about 600 g/mol to about 3,000 gm/mol, or alternatively of about 800 g/mol to about 2,500 gm/mol, or alternatively of about 900 g/mol to about 2,000 gm/mol. In one aspect, the PEG component has a molecular weight of about 1000 g/mol. In another embodiment, the polyethylene glycol is selected from PEG 600, PEG 1000, PEG 1500, PEG 2000 and PEG 4500 which are commercially available. In a particular aspect, the polyethylene glycol is PEG 2000.

General Synthesis Route of Main Chain Azobenzene-Containing Responsive Polymers

Figure 2:
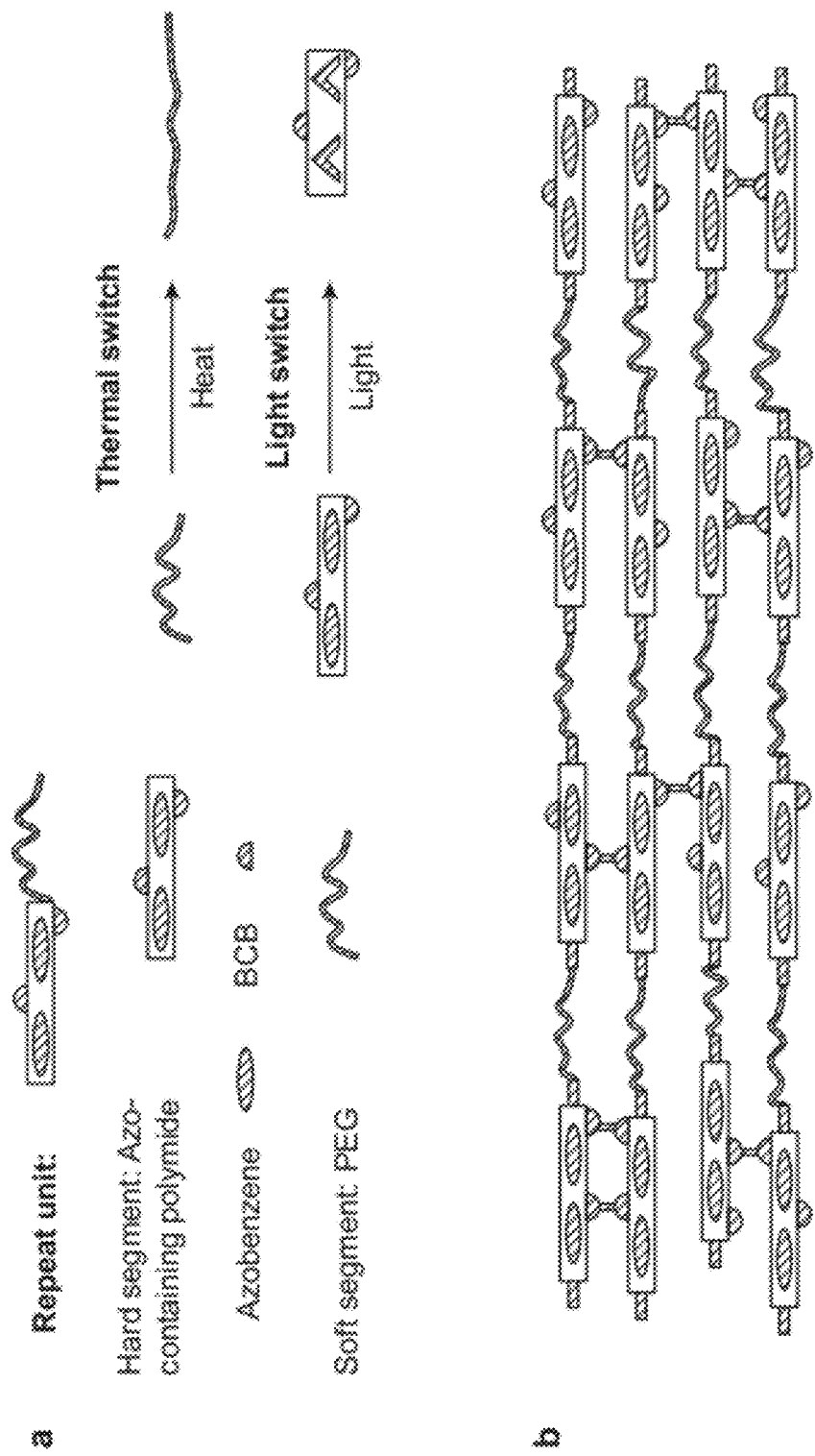
Figure 3:
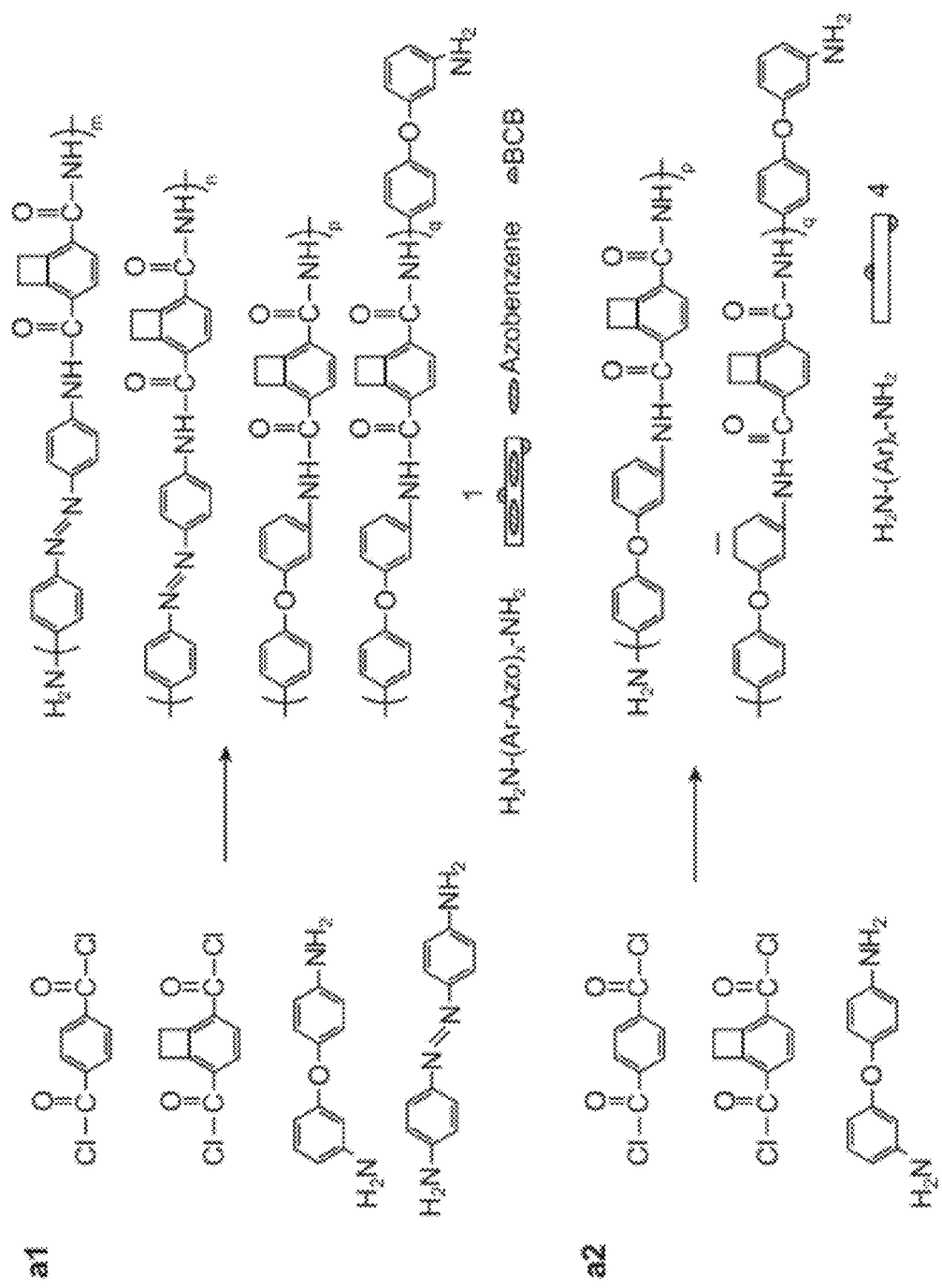
FIG. 3b illustrates conversion of PEG 2 to acid chloride end groups and subsequent reaction with 1 or 4 to form alternating block polymers.
FIG. 3c illustrates schematic drawing to depict alternating rod and coil segments and self assembled domains with rod segments covalently linked with inorganic surfaces.
Figure 3:
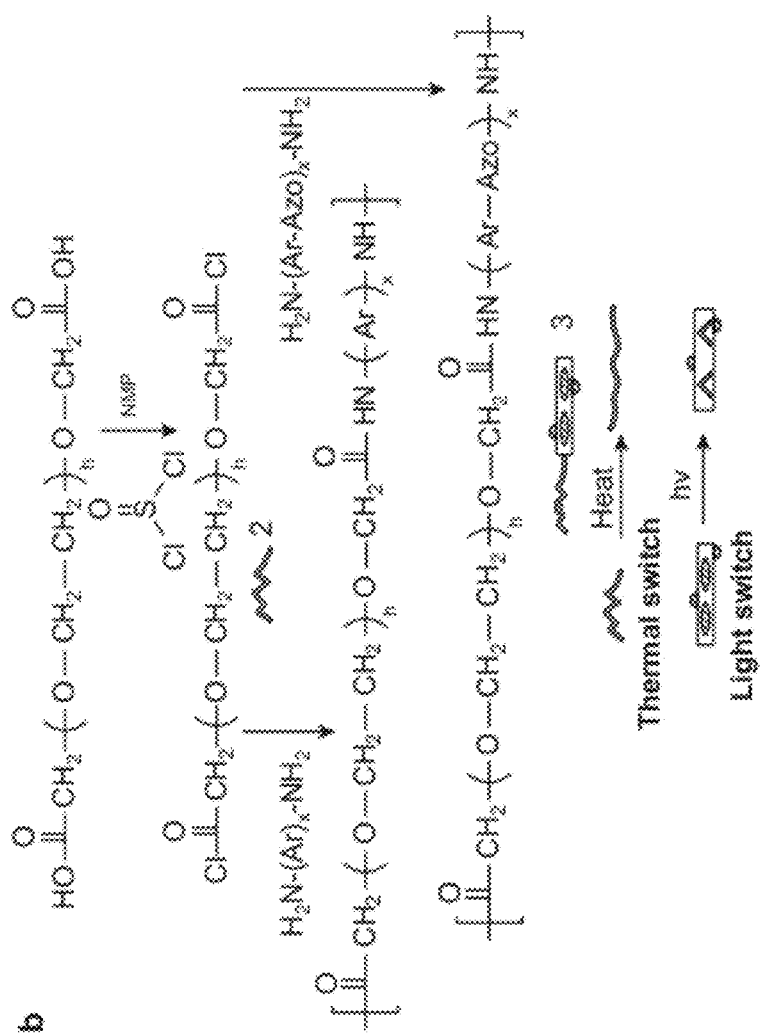

The general synthetic scheme for the synthesis of azobenzene-based BCB-containing polymers of this disclosure is outlined in FIG. 3(a1, a2, b). To be both light and thermally sensitive, the amine-terminated aromatic polyamide "hard" segment 1, $H_2N$—$(Ar-Azo)_x$-$NH_2$, is synthesized by using excess 3,4'-diaminodiphenyl ether as shown in FIG. 3a1. A stoichiometric imbalance is employed to control the molecular weight of 1. The ratio of 1, 2 dihydrocyclobutabenzene 3,6 dicarboxylic acid chloride and terephthaloyl chloride is varied to control the number of BCB thermal crosslink sites. The initial carboxymethyl-terminated PEG "soft" segment is first converted to acid chloride end groups 2. The amine-terminated 1 is then be used to react with acid chloride end groups of 2 as shown in FIG. 3b. An alternating block copolymer 3 is formed. FIG. 3a2 depicts the synthetic scheme of the amine-terminated aromatic polyamide 4 without azobenzene groups, $H_2N$—$(Ar)xNH_2$, for generating thermally responsive only thin films. These polymer systems have been synthesized with varied chain length typically between 5 to 100, or alternatively between 15 to 25, e.g., between 17 to 23, or 21, and percentage of BCB groups as detailed in the Examples.

The aromatic polyamide units (I) or (4) are expected to closely associate which each other to form semicrystalline rod domains, while the associated polyethylene oxide (PEO) 2 forms coil and amorphous domains. The rod domains containing azobenzene (photoresponsive) and BCB (thermal crosslinker) groups in close proximity self-assemble around piezoelectric nanostructures coated with the block copolymer modifier. After thermally induced cycloaddition reaction, the covalent linkage between responsive polymer and piezoelectric nanostructures are established. Additional crosslinking among themselves (BCB to BCB and BCB to double bonds within polymer) can increase rigidity thus promoting synergetic interaction with high modulus nanostructures.

Applicants' nanomaterial-responsive polymer composite made from main-chain azobenzene polymer exhibited rapid response to visible light with unprecedented quick recovery.

Thus, this disclosure also provides a process for making a responsive polymer comprising, or alternatively consisting essentially of, or yet further consisting of, a rod segment that deforms upon light stimulation and a coil segment that deforms upon thermal stimulation. The process comprises, or alternatively consists essentially of, or yet further consists of coupling a diamine with a dicarboxylic acid dihalide in a ratio of about 0.3 to 3, or to provide a rod segment comprising a polyamide that contains azobenzene groups and then coupling this product with a dicarboxylic acid dichloride (in a ratio of about 0.3 to 3) comprising a polyether, polysiloxane, or a combination thereof and then thereafter coupling the product with a diamine (in a ratio of about 1:1 or alternatively about 1:2, or 2:3, or 3:4, or 4:5, or 0:1). In one embodiment, the dicarboxylic acid dihalide is a dicarboxylic acid dichloride.

Examples of diamines that can be used in this process include, but are not limited to, 1,4 diaminobenzene; 1,3 diaminobenzene; 4,4'-azodianiline; 4,4'-diaminobenzophenone; 4,4'-diaminodiphenyl-methane; 9,9-bis(4-aminophenyl)fluorene; 4,4'-diaminodiphenylether; 2,2'-bis(trifluoromethyl)-4,4'-diaminobiphenyl; 3,4'-diaminodiphenylether; 4,4'-bis(4-aminophenoxy)biphenyl, etc.

Examples of dicarboxylic acid dichlorides that can be used in this process include, but are not limited to, benzene dicarboxylic acid dichloride; substituted benzene dicarboxylic acid dichloride; benzocyclobutane dicarboxylic acid dichloride, substituted benzocyclobutane dicarboxylic acid dichloride, alkanedioyl dichloride ($C_4$-$C_{20}$), substituted alkanedioyl dichloride ($C_4$-$C_{20}$), where one or more substituents on the dicarboxylic acid dichloride are selected from alkyl (C1-C8), hydroxyl, halo, cyano, nitro, alkenyl (C2-C8), carboxyl, ester, etc. Some of the examples include, 1,2-dihydrocyclobutabenzene-3,6-dicarbonyl dichloride, PEG containing dicarboxylic acid dichloride, phthallic acid dichloride, isophthallic acid dichloride, terephthallic acid dichloride, naphthalene dicarboxylic acid dichloride, dodecanedioyl dichloride, etc.

The dicarboxylic acid dichlorides are either commercially available or are synthesized in one step from the corresponding dicarboxylic acid by treatment with excess of thionyl chloride. Typically, the reaction is done in presence of a base, such as N-methylpyrrolidone (NMP), at 0° C. As known to one of skill in the art, other methods, such as one using phosgene, can also be used.

The solvent for the coupling reaction is selected from N-methylpyrrolidone (NMP), N,N-dimethylacetamide, N-methyl piperidine, N,N-dimethylformamide, dimethyl sulfoxide, or a combination thereof.

Preferred reaction conditions for the coupling of a diamine with a dicarboxylic acid dichloride comprise treating the diamine with the dicarboxylic acid dichloride in about 1:1 molar ratio in anhydrous NMP and $CaCl_2$ at 0° C. The reaction mixture is typically stirred for about 24 hours while it is allowed to warm to room temperature to yield the coupled product. As known to one of skill in the art, other coupling conditions, such as one using N,N-dimethylacetamide and triethylamine, can also be used.

General Synthesis Route of Side Chain Azobenzene Responsive Polymers

Figure 4:
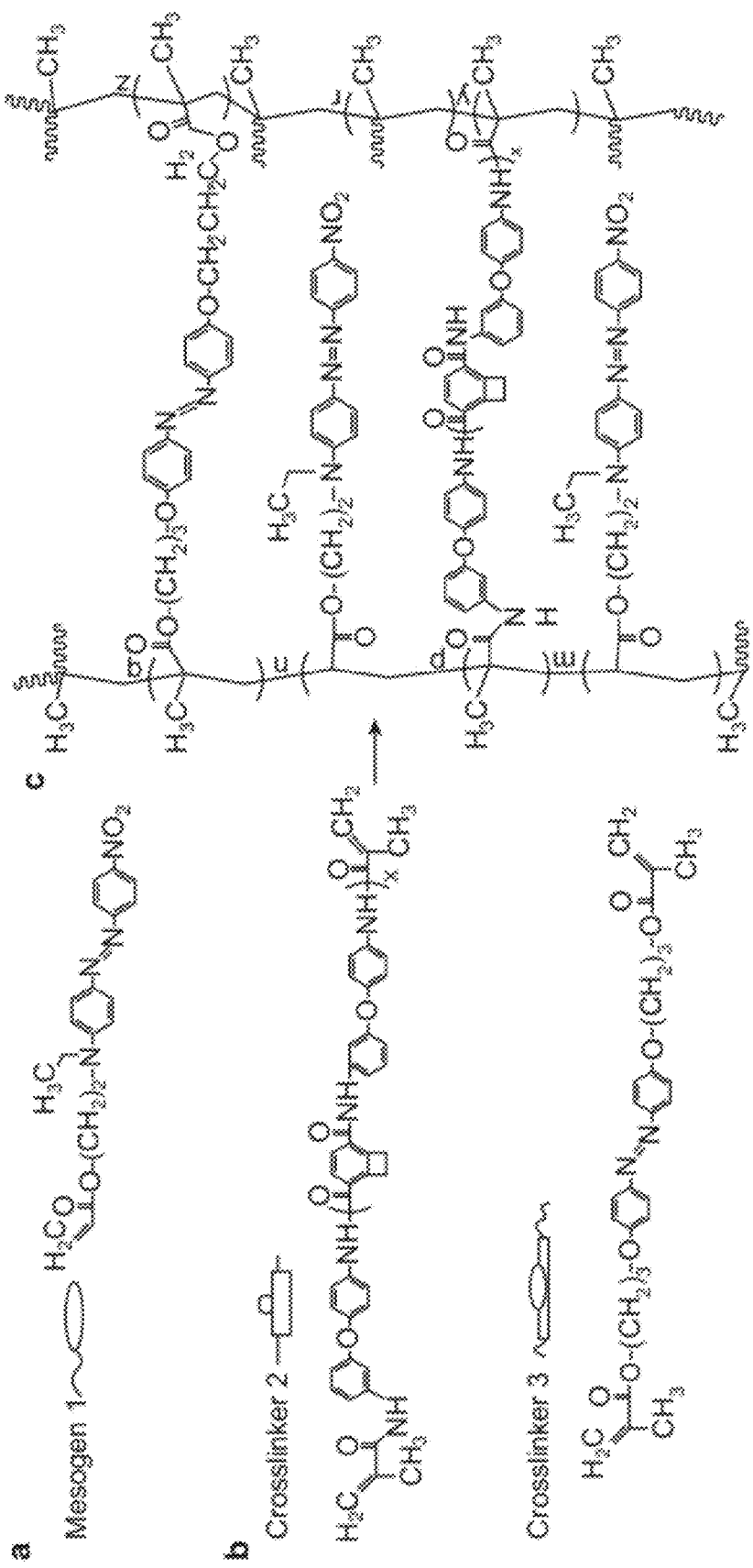
FIG. 4, panels a through c, illustrates synthetic schemes for preparation of side-chain based azobenzene polymer.

The side chain azobenzene polymer is synthesized from the three units as shown in FIG. 4a. A long wavelength absorbing azobenzene acrylic monomer 1 is utilized along with and a BCB-containing crosslinker 2 and an azobenzene-containing crosslinker 3.

The synthesis of the crosslinker 2 is shown in FIG. 4b. Initially BCB-based diacid chloride is reacted with 3,4'-diaminodiphenylether (Park et al., (1995) Journal of Polymer Science Part a—Polymer Chemistry 33:1031-1037; Zulfiqar and Sarwar (2009) High Performance Polymers 21:3-15; Zulfiqar et al. (2007) Colloid and Polymer Science 285:1749-1754; Faghihi et al. (2007) Journal of Chemistry 31:65-73). A stoichiometric imbalance is employed to control the molecular weight and 3,4'-diaminodiphenylether is used in excess to result in amine-end capped aromatic polyamides. The amino end groups are then converted to methacrylate groups by reaction with methacryloyl chloride in the presence of triethylamine. After aligning the responsive polymer precursor using piezoelectric nanostructures, a responsive network is then photocured with aligned Azo mesogens in the all trans state. Additional thermal crosslinking between BCB and vinyl groups on the surfaces of piezoelectric material is then carried out. The resulting structure is illustrated in FIG. 4c. In this case, azobenzene groups function as mesogens as well as photosensitive groups which are tethered onto a flexible acrylic main chain as opposed to the rigid aromatic main chain. NMP or similar dipolar solvents are used for synthesis and film casting.

1D Nanomaterials and Direct Route of 1D Nanomaterials Synthesis

Inorganic 1D nanomaterials have extremely large surface area and thus make them very attractive to make nanohybrids whose functionalities are dictated by effective load transfer across interface. The unconfined longitudinal axis provides a path to "convey" the dynamic change that they are experiencing to conventional detection devices.

The disclosure provides a new type of hybrid material that combines 1D nanomaterials with the inventive polymers as described above, e.g., single, double and multi-walled CNTs, piezoelectric 1D nanomaterials, ferroelectric 1D nanomaterials, electronic 1D nanomaterials, ferromagnetic 1D nanomaterials in 1D nanotubes, nanowires, nanorods, nanobelts format. They can be arranged in 2D or 3D configuration and suspended 1D nanostructures which in one aspect, can be further surface modified.

Compared to most polymeric materials, they are more elastic. Thus amalgamating them with polymer will render the nanohybrid more elastic. The reduced elasticity with size will make the mechanical mismatch less dramatic to prevent energy and load transfer. Other anisotropic properties will be surfaced due to dimensional anisotropicity. For example, flexoelectricity is a "nano-effect" that describes ordinary materials at nanoscale dimension behaving like piezoelectric ones. This effect coupled with extreme dimensional confinement make the piezoelectric effect more profound for 1D nanostructures (Zhao et al. (2004) Nano Letters 4:587-590; Morozovska et al. (2006) Phys. Rev. B. 73:214106).

Methods of manufacturing nanomaterials are known to those of skill in the art. The following examples are illustrate how to create light-weight revolutionary actuators and transducers by exploiting the conventional method for direct synthesis and integration.

1D Piezoelectric Materials
Binary 1D Piezoelectric Materials,

ZnO (Eg=3.37 ev) and AlN (Eg=6.2 ev) has a non-central symmetric wurtzite structure. AlN has an excellent electromechanical coupling factor and has achieved commercial success for surface acoustic wave filter application in mobile phones (Kim et al., (2002) Journal of Ceramic Processing Research 3:25-28; Mortet et al., (2004) Diamond and Related Materials 13:1120-1124; Dubois and Muralt (1999) Applied Physics Letters 74:3032-3034; Ruby et al., III 2001 IEEE Ultrasonics Symposium. Proceedings. An International Symposium (Cat. No. 01CH37263) 2001, 813-21). This very light weight material can act as a "charge pump" due to excellent piezoelectric properties. Charge annihilation, easily occurring in semiconducting ZnO nanowires, is no longer a concern. As a result, it can also act a "capacitor" to store generated charges. Consequently, simple metal electrodes are used for charge transport. AlN nanowires and nanorods are also synthesized via vapor-based methods (Shen et al., (2008) Journal of Alloys and Compounds 465:562-566; Zhao et al., (2005) Applied Physics Letters 86:193101-193103; Tang et al. (2005) Chemical Physics Letters 416:171-175; Yang et al., (2006) Nanotechnology 17:S321-S326).

ZnO is very easily to be synthesized using wet and vapor-based synthesis methods and have demonstrated kinetic energy harvest capability see for example Xu, et al. (2010) DOI: 10.1038/NNANO.246 and Yang, R. S. et al. (2009) Nature Nanotech. 4: 34-39.

Relatively facile synthesis methods for producing desired stoichiometry and proper crystal orientation nanowires, make these two materials strong contenders for energy harvesting along with perovskite-based ceramic materials.

1D perovskite materials such as BaTiO3, $PbTiO_3$ and lead zirconate titanate ($PbZr_{0.52}Ti_{0.48}O_3$) type structures have very piezoelectric coefficient. They can be synthesized into 1D nanostructures by solution synthesis or the top down lithographic method. They have shown enhanced kinetic energy harvesting capability (Qi, et al. (2010) Nano Lett. 10:524-528) device platforms.

Carbon Nanotubes

Carbon nanotubes are extremely light with exceptional mechanical properties. MWCNTs are metallic and conductivity better than copper. For SWNT and their conductivities can be ranging from metallic to semiconducting depending on chirality and number of walls. They are excellent UV absorber. This property has been exploited to generate propeller action by remotely heating one portion of a surface and also used to cause local eruption.

Ferromagnetic Materials

Electromagnetic transduction employ ferromagnetic material as permanent magnet and movement of coil induce electricity.

Synthesis of Ensembles of Ordered 1D Nanomaterials of this Disclosure 1D nanomaterials can be synthesized using bottom up self-assembly based synthesis technique via using precursors in a liquid or vapor form. They also can be synthesized using template-based approach. Alternatively, imprinting and top-down lithography using conventional optical lithography can be used to generate 1N 1D nanobelts or 1D nanoribbons.

Self-Assembly Approach of this Disclosure

Catalyst Preparation and Horizontally Aligned 1D Nanostructures Using Vapor-Based Synthesis.

Figure 5:
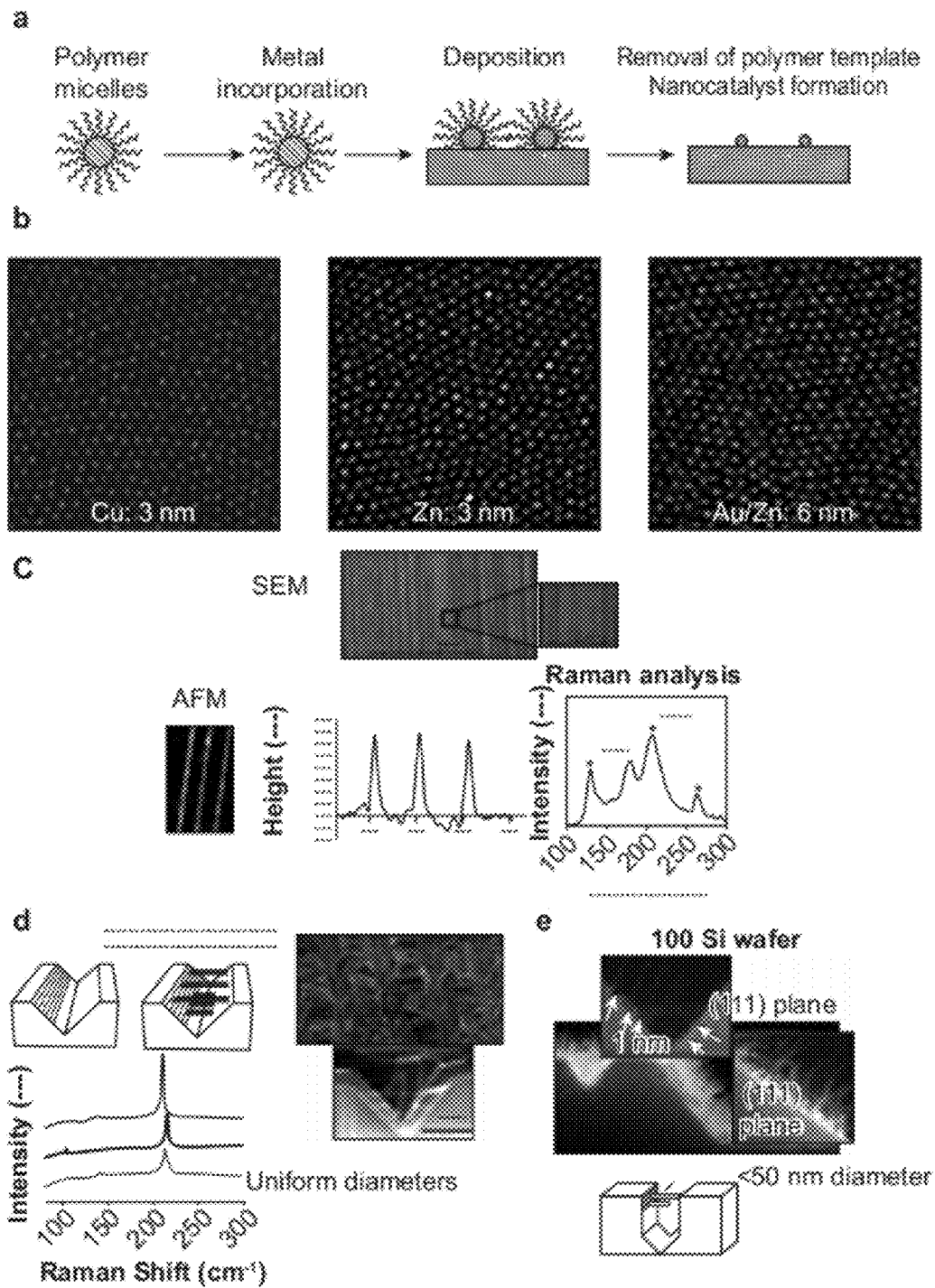
FIG. 5a Schematic drawing of nanoparticles formed via the solution sequestration approach.
FIG. 5b shows AFM images (1 by 1 μm) of nanocatalysts.
FIG. 5c are (i) SEM image showing aligned CNTs grown on surface and (ii) AFM image showing unfirm diameter CNTs have been generated.
FIG. 5d shows uniform coating on the sidewalls (lower left) and conceptual drawing of CNT growing from nanocatalysts derived from polymer micelles (upper left). Representative cross-section SEM images after CNT growth. Black arrows pinpoint locations of sidewalls on which CNTs are attached (left).
FIG. 5e shows suspended growth of ZnO nanowires on sloped (111) plane (top) illustrating that suspended ZnO nanowires can be grown from vertically oriented (111) plane (bottom).

Block copolymers such as polystyrene-b-[poly(4-vinylpyridine) offers excellent metal sequestration ability to minimize unreacted species and e size control can also be used to synthesize nanocatalysts. FIG. 5a-b show that a variety of nanocatalysts with tunable size and adjustable composition can be created. Furthermore, nanocatalysts derived from this approach will not agglomerate at the growth temperature. Uniform-sized and highly active nanocatalysts produced by this approach enable the growth of monodispersed 1D nanomaterials at high yield since the catalyst due to oversaturation or under feeding will be avoided and all of them will participate in nucleation and growth. Consequently, uniform sized nanotubes can be created as demonstrated by the result shown in FIG. 5c. In this case, ethanol is a carbon precursor. By depositing nanocatalysts on the sidewalls of a trench, suspended CNTs shown in FIG. 5d can be produced by vapor-based synthesis such as using methane as precursor. Suspended ZnO nanowires can be also formed as described in FIG. 5e. The diameter and density of 1D nanomaterials is tuned by catalyst size and spacing which is determined by block copolymer templates. The ensemble of high-density 1D nanostructures is of important. For example, high density and uniform diameter piezoelectric nanowires will all participate in energy generation constructively, greatly enhanced power output.

Figure 6:
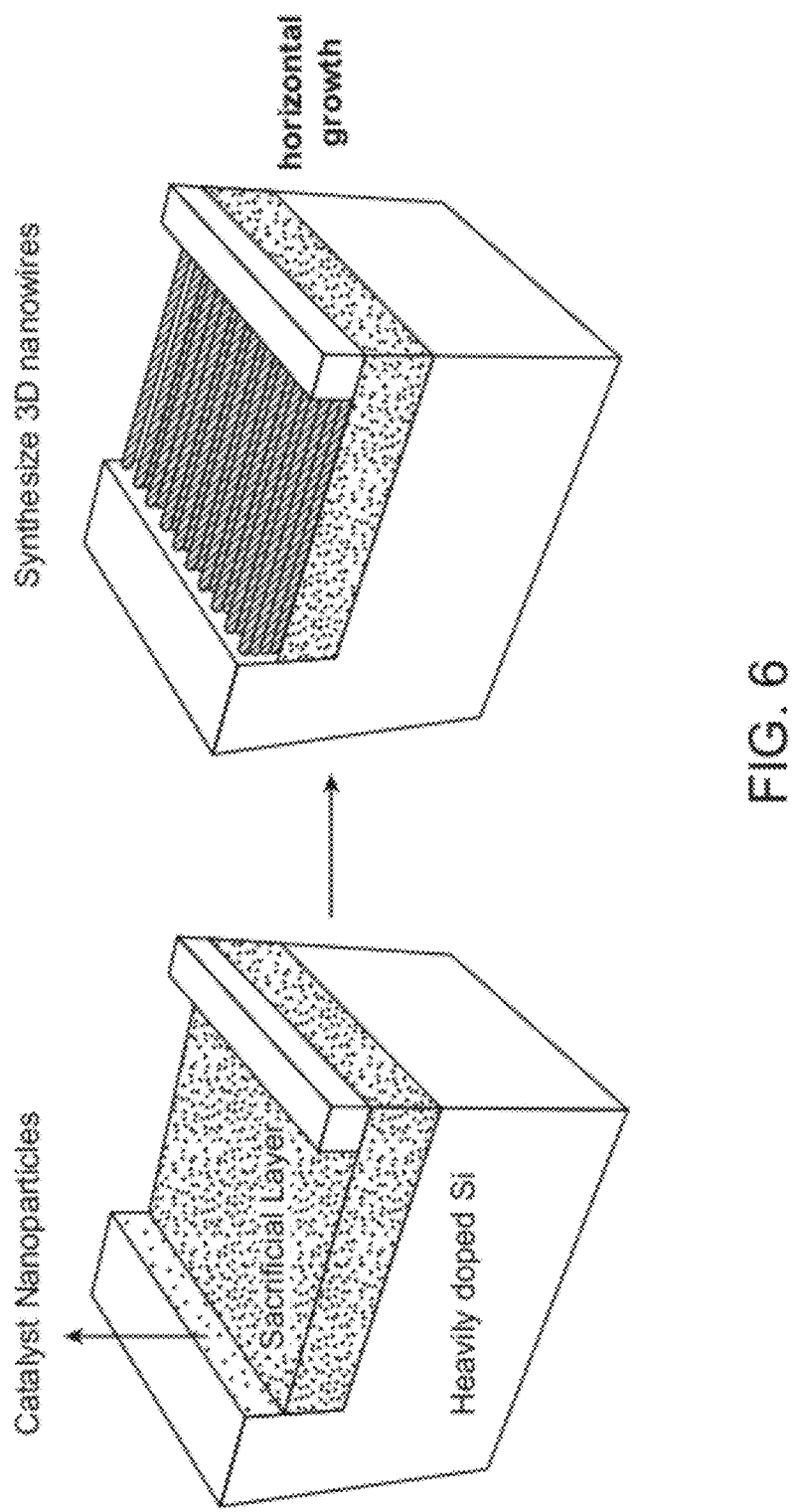
FIG. 6 shows the synthesis of 1D nanostructures arranged in a 3D format in this disclosure.

Horizontally Aligned 1D Nanostructures Using Solution Based Synthesis (FIG. 6)

It has been reported that 1D nanostructures such as ZnO nanowires can be synthesized using the solution-based synthesis. For example, $Zn(NO_3)_2$ as a Zn source and EDTA (ethylenediamine) as a carrier and cetyltrimethylammonium bromide (CTAB) surfactant, uniform rods can be generated. (Bin Liu and Hua Chun Zeng (2004) Langmuir Vol. 20:4196-4204). Using ZnO seeds, epitaxy aligned growth can be realized. For example, horizontally aligned ZnO nanowires can be generated using ZnO seeds on the sidewalls after baking the substrate in a mechanical convection oven to 95 C for 4 h. using 1:1 ratio of zinc nitrate hexahydrate and hexamethylenetetramine (HMTA). (Sheng Xu (2010) Nature Nanotechnology, ADVANCE ONLINE PUBLICATION DOI: 10.1038/NNANO.2010.46).

Figure 7:
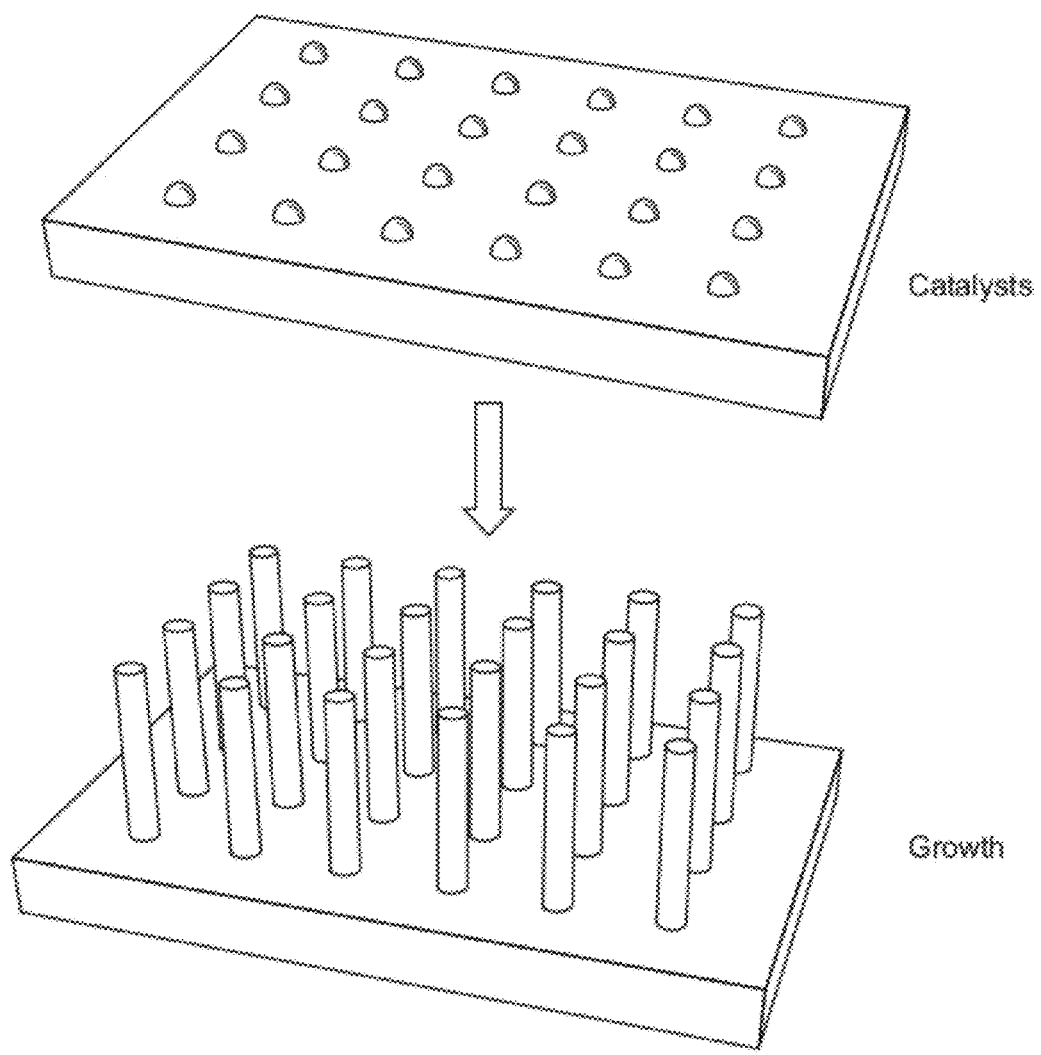
FIG. 7 shows the synthesis of vertically aligned 1D nanostructures.

Vertically Aligned Growth (FIG. 7)

To grow aligned functional 1D nanomaterials using the vapor-based techniques, catalyst seeds with desirable properties are general required to promote vertical orientation and locational control. For example, using ZnO seeds, vertically aligned ZnO nanorods have been generated. (Cha et al. (2008) Nanotechnology 19:235601 and Lori E. et al. (2005) NANO LETTERS Vol. 5(7):1231-1236). Analogously, using nanocatalysts of the same type, 1D nanostructures, ZnO and PZT as an example, can also be synthesized in solution. (Lori E. et al. (2005) NANO LETTERS Vol. 5(7):1231-1236; Renee B. et al. (2004) Langmuir 20:5114-5118, and Lin, et al. (2009) Applied Physics Letters 95:122901; doi:10.1063/1.3237170 (3 pages)).

Templating and Imprinting Approach

Besides the catalyst seed regulated bottom-up self-assembly approach, using porous templates such as porous anodic $Al_2O_3$, vertically aligned binary and ternary inorganic nanowires and nanotubes can be synthesized using methods known in the art and described for example in (Wehrspohn and Schiling (2001) MRS Bull. 26:623 and Yun Luo et al. (2003) Appl. Phys. Lett., Vol. 83(3):440).

Figure 8:
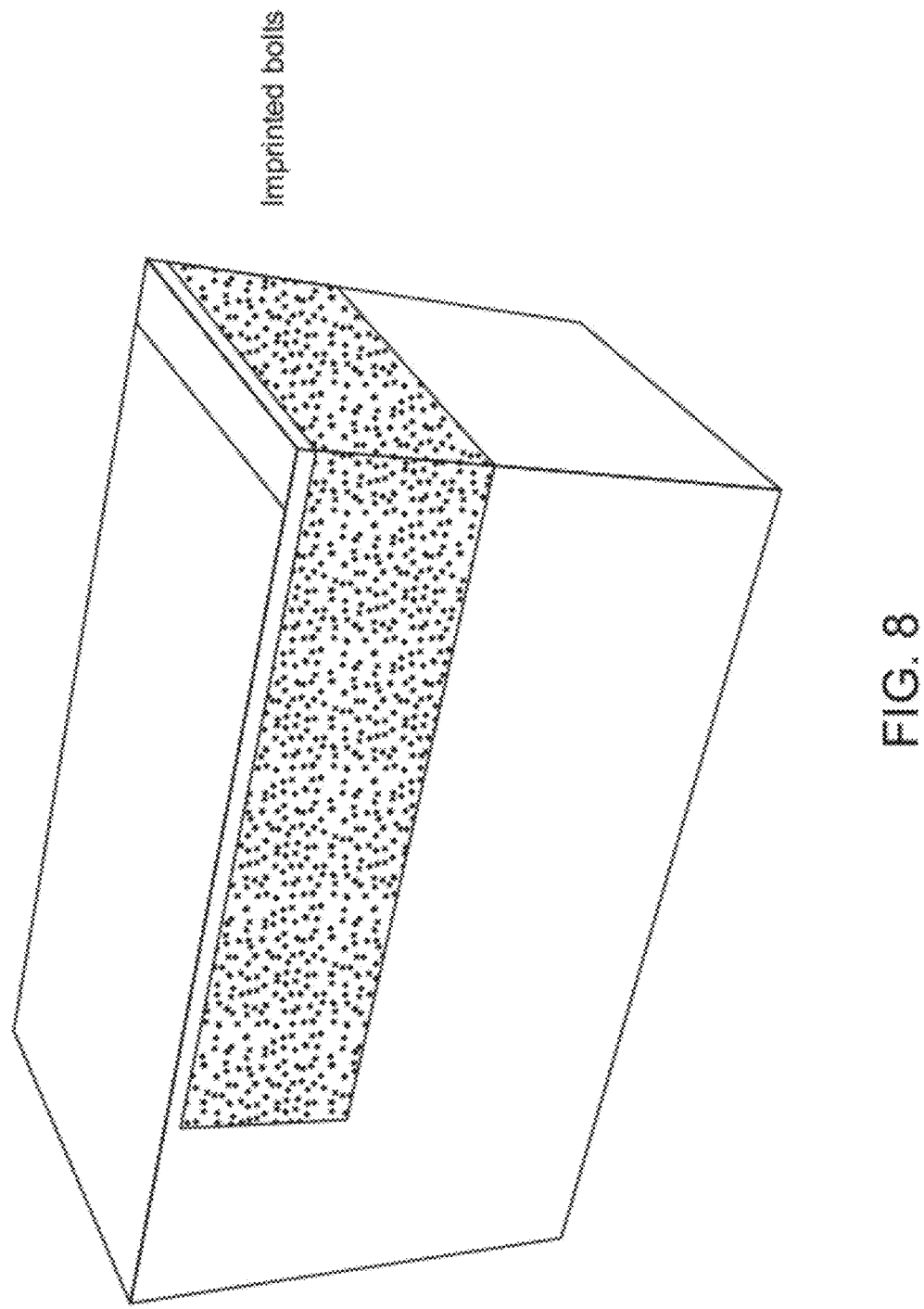
FIG. 8 shows 1D nanobelts on surface in a 2D format.

Imprinting to Generate 2D Nanobelts (FIG. 8)

Organometallic polymers are excellent precursors to form shaped ceramics (Peuckert et al., (1990) Advanced Materials 2:398-404; Yang et al. (1998) Science 282:2244-2246; Termoss et al. (2009) Journal of the European Ceramic Society 29:857-861). For example, poly[N-alkylimino)alanes] are excellent precursors for AlN ceramics with high yield. At least two other types precursors can be used for imprinting, a solution of partially gel prepared from the sol-gel approach or a solution that composes of nanoparticles mixed with polymer binder. After pyrolysis, thin ceramic belts are formed. Due to radial confinement imposed by the boundary condition, the elongated grains are oriented along <0001> direction, along the length of the belt. This is a well known phenomenon in 1D nanomaterials synthesis.

Top-Down Lithography

Anisotropic thin films of functional nanomaterials can be deposited by various sputtering techniques such as pulsed laser deposition, magnetron sputtering, ion milling and plasma-assisted deposition using techniques known in the art and described for example in Woo Lee et al. (2008) Nature Nanotechnology 3:402; Journal of Crystal Growth (2007) 306:288-291, Akiyama et al. (2007) Adv. Funct. Mater 17:458-462; Pandey A. R. et al. (2004) Materials Science & Engineering B 112:96-100. Using either a lift-off process which involves hard mask or a photoresist-protected etch process, nanobelts arranges can be formed (FIG. 8). The patterned photoresist layer or hard mask such as (SiO2) can be formed by lithography (optical, e beam, or interference).

Synthesis of 1D Nanomaterials

1D Piezoelectric Materials

Binary 1D Piezoelectric Materials,

ZnO (Eg=3.37 ev) and AlN (Eg=6.2 ev) has a non-central symmetric wurtzite structure. AlN has an excellent electromechanical coupling factor and has achieved commercial success for surface acoustic wave filter application in mobile phones (Kim et al. (2002) Journal of Ceramic Processing Research 3:25-28; Mortet et al. (2004) Diamond and Related Materials 13:1120-1124; Dubois et al. (1999) Applied Physics Letters 74:3032-3034; Ruby et al. III (2001) IEEE Ultrasonics Symposium. Proceedings. An International Symposium (Cat. No. 01CH37263) 2001, 813-21). This very light weight material can act as a "charge pump" due to excellent piezoelectric properties. Charge annihilation, easily occurring in semiconducting ZnO nanowires, is no longer a concern. As a result, it can also act a "capacitor" to store generated charges. Consequently, simple metal electrodes are used for charge transport. AlN nanowires and nanorods are also synthesized via vapor-based methods described for example in Shen et al. (2008) Journal of Alloys and Compounds 465: 562-566; Zhao et al. (2005) Applied Physics Letters 86:193101-193103; Tang et al. (2005) Chemical Physics Letters 416:171-175; Yang et al. (2006) Nanotechnology 17:S321-S326.

ZnO is very easily to be synthesized using wet and vapor-based synthesis methods and have demonstrated kinetic energy harvest capability (Xu, et al. (2010) DOI: 10.1038/NNANO.246 and Yang, R. S. et al. (2009) Nature Nanotech. 4: 34-39).

Relatively facile synthesis methods for producing desired stoichiometry and proper crystal orientation nanowires, make these two materials strong contenders for energy harvesting along with perovskite-based ceramic materials.

1D perovskite materials such as BaTiO3, $PbTiO_3$ and lead zirconate titanate ($PbZr_{0.52}Ti_{0.48}O_3$) type structures have very piezoelectric coefficient. They can be synthesized into 1D nanostructures by solution synthesis or the top down lithographic method. They have shown enhanced kinetic energy harvesting capability (Yi Qi et al. (2010) Nano Lett. 10:524-528).

Carbon Nanotubes

Carbon nanotubes are extremely light with exceptional mechanical properties. MWCNTs are metallic and conductivity better than copper. For SWNT and their conductivities can be ranging from metallic to semiconducting depending on chirality and number of walls. They are excellent UV absorber. This property has been exploited to generate propeller action by remotely heating one portion of a surface and also used to cause local eruption of vesicles that contains CNTs.

Ferromagnetic Materials

Electromagnetic transduction employs ferromagnetic material as permanent magnet and movement of coil induce electricity.

3D Nanomaterials

The 3D nanomaterial is prepared by fabricating a 3-dimensional array of suspended, isolated, and pristine CNTs. These methods are known in the art and described for example in Examples 8 and 9 herein.

Interface Engineering of this Disclosure: Block Copolymer Surface Modifiers

Figure 10:
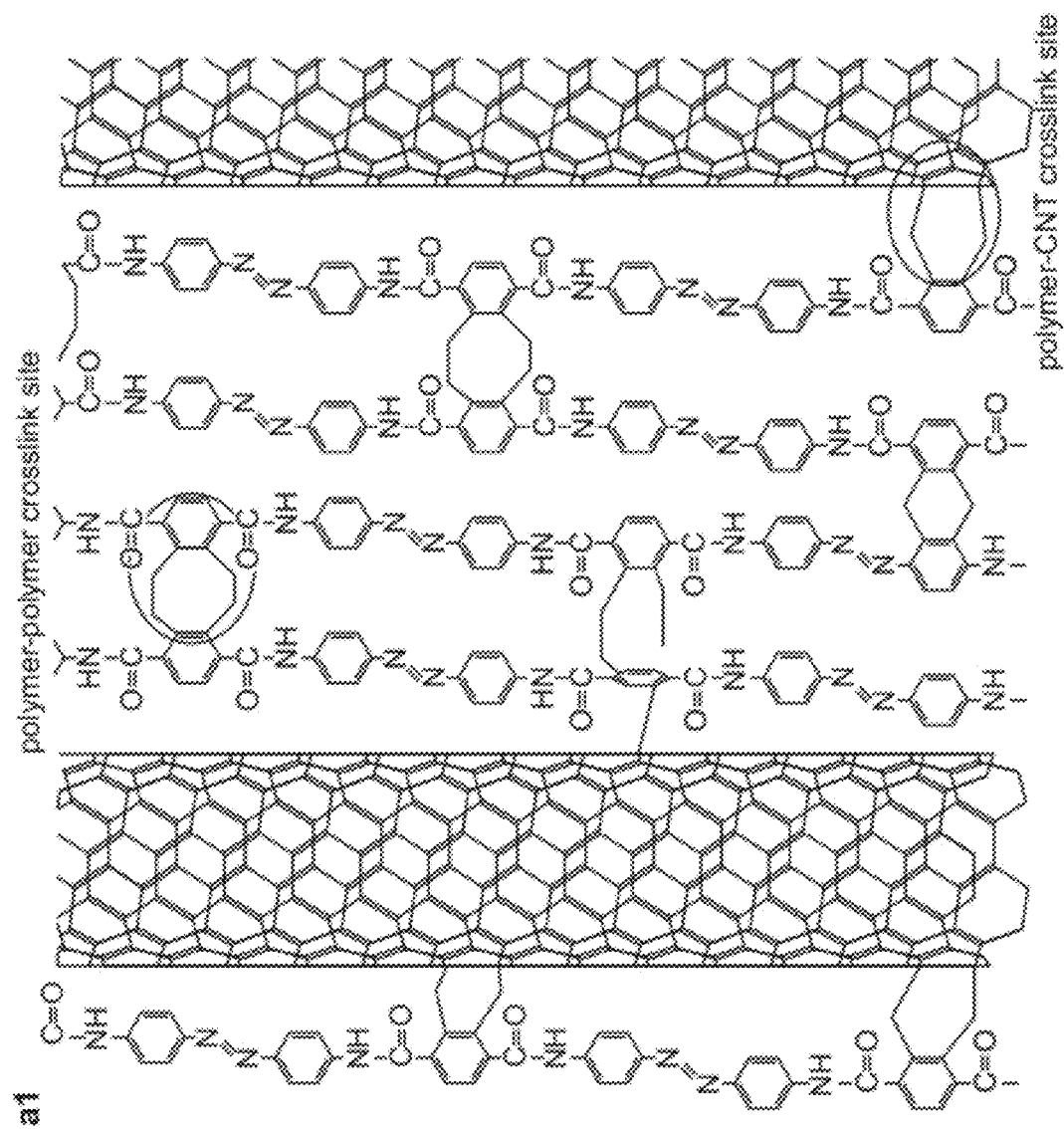
FIG. 10 illustrates how to functionalize inorganic nanomaterial surface with double bonds.
Figure 10:
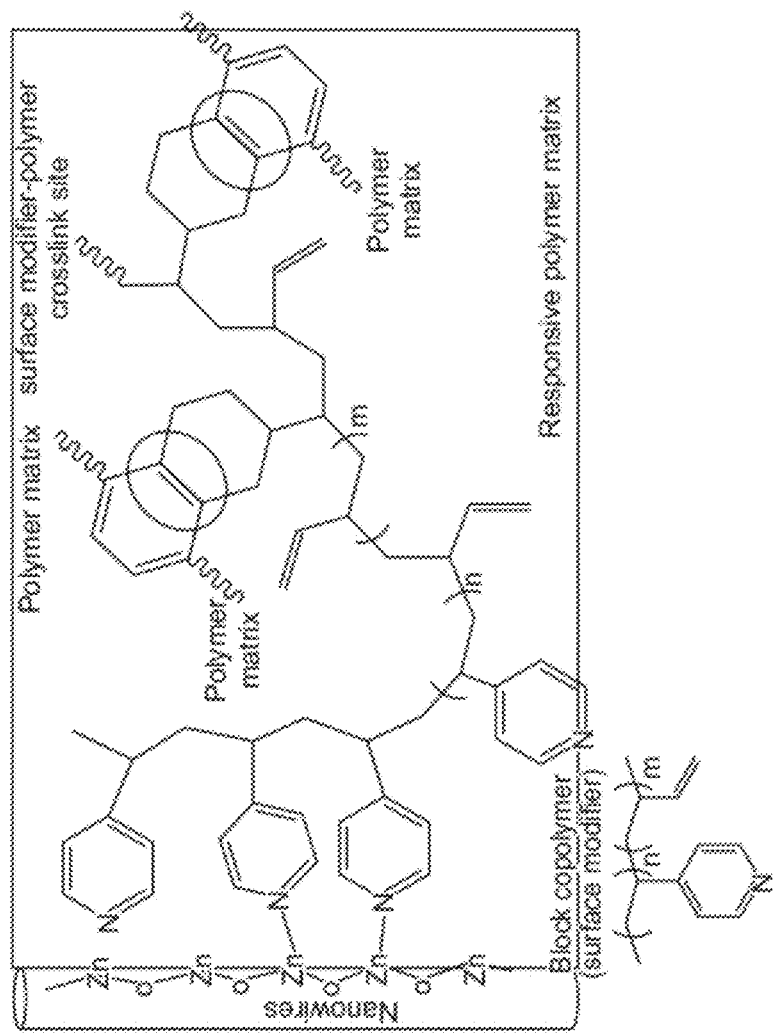
Figure 10:
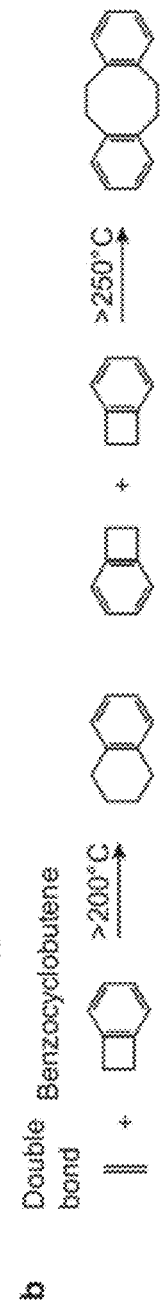

Interface is essential for smart materials to acquire desirable dynamic force and energy transfer. By employing vinyl-containing block copolymers, the hydrophilic segment are chelated with nanowire surfaces (N—*$Zn^{2+}$) while the hydrophobic vinyl-containing segment reacts with a benzocyclobutene-based cross-linker, a part of responsive polymer network as illustrated in FIG. 10. The extent of interaction and subsequently their dynamic interplay can be adjusted by the number of bonds present; force and energy transfer and conversion is tuned accordingly for specific applications.

Cycloaddition

Connectivity between the responsive polymer and nanomaterials is achieved by the Diels-Alder reaction between benzocyclobutene (BCB) groups on the polymer main chains and strained double bonds on CNT surfaces as illustrated in FIG. 10a1 or double bonds on nanowire surfaces after functionalized by a vinyl-containing block copolymer surface modifier as depicted in FIG. 10a2. FIG. 1b also illustrates the covalent coupling formed between polymer chain and nanomaterials. Thermally crosslinkable BCB groups react with double bonds above 200° C. and with other BCB groups above 300° C. through cycloaddition as shown in FIG. 1b and FIG. 10b (Sakellariou et al. (2007) Chem Mater 19(26): 6370-6372; Priftis et al. (2009) Macromolecules 42(9):3340-3346; Gugel et al. (1996) Tetrahedron 52(14):5007-5014; Gügel et al. (1994) Angew Chem Int Ed Engl 33(5): 559-561; Deeken and Farona (1992) Polymer Bulletin 29:295-301; Dean (1993) J Appl Polym Sci 47(11): 2013-2017; Fishback and Farona (1993) J Polym Sci Pol Chem 31(11): 2747-2750; Dean (1994) J Polym Sci Pol Chem 32(3):567-569; Walker et al. (1994) Polymer 35(23): 5012-5017). Therefore, the two-stage thermal reaction renders covalent linkage throughout.

One of the salient features of the proposed crosslinking method is that there is very low shrinkage associated with this type of ring-opening reaction. Therefore stress-free films with excellent mechanical and chemical integrity are obtained. Consequently, built-in stress normally generated by many other networking reactions which often leads to catastrophic failures and voids is eliminated (Brinker and Scherer "Sol-Gel Science: The Physics and Chemistry of Sol-Gel Processing", Academic Press, Inc.: New York, 1990; Exton "Difunctional acrylic monomers: evaluating the physical properties of the glycol ether series vs. the hydrocarbon diol series", available at Sartomer.com). Furthermore the extent of connectivity between polymer chains and polymer and 1D nanomaterials can be rationally adjusted by the number of reactive sites. Therefore, Applicants can tune the connectivity for specific applications. This simple and powerful approach is applied to a wide spectrum of heterogeneous systems.

Double Bonds on 1D Nanomaterials Surfaces.

Figure 17:
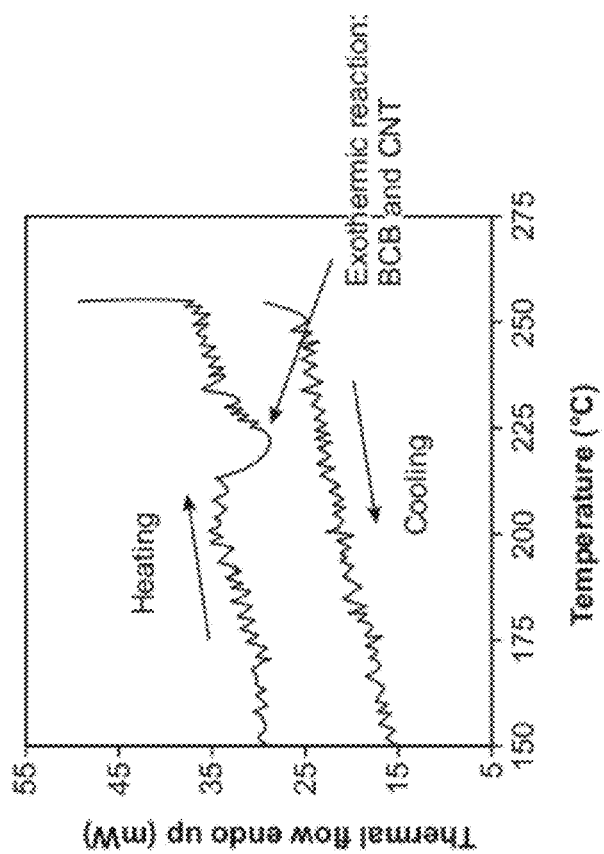
FIG. 17 illustrates film curling and uncurling when a CNT-polymer film was moved between 40° C. and 35° C. zones. Right: DSC data showing exothermic reaction of BCBs and CNTs.
Figure 17:
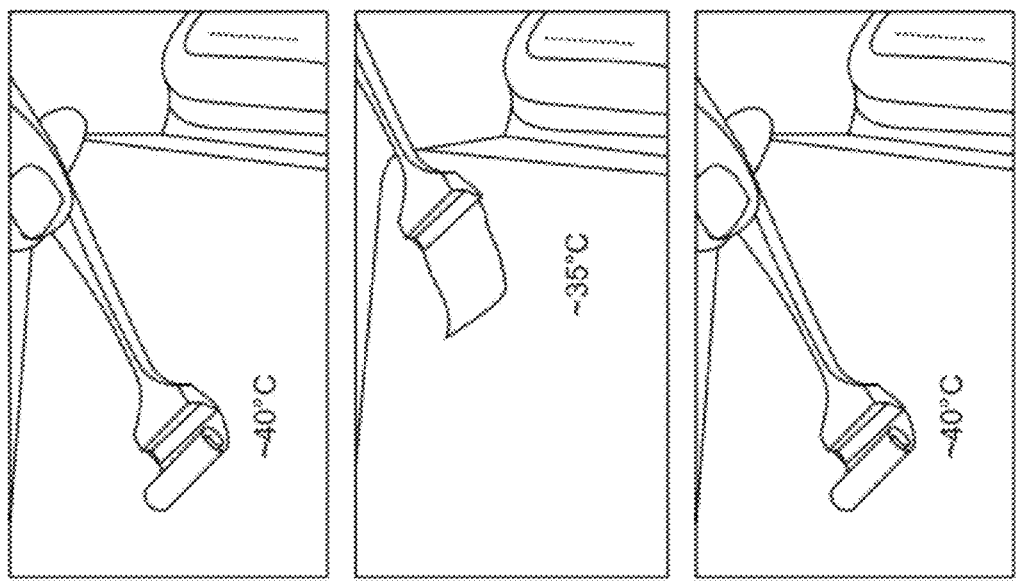

For CNTs, there are plentiful strained double bonds on single and double walled carbon nanotubes available for reaction with BCB groups. BCB groups on the polymer main chains are known to thermally react with both CNTs and buckyballs (Sakellariou et al. (2007) Chem Mater 2007 19(26):6370-6372; Priftis et al. (2009) Macromolecules 42(9):3340-3346; Gugel et al. (1996) Tetrahedron 52(14): 5007-5014; Gugel et al. (1994) Angew Chem Int Ed Engl 33(5):559-561). Differential Scanning calorimetry (DSC) data indicates that this reaction occurs in a range from about 180° C. to about 260° C., preferably in a range of about 200° C. to about 240° C., and more preferably at about 220° C. as shown in FIG. 17.

For 1D inorganic nanomaterials, a vinyl-containing block copolymer surface modifier can be employed to generate double bonds on the surface of a piezoelectric 1D nanostructure, such as a ZnO nanowire. The hydrophilic segment of a vinyl-containing block copolymer consisting of a large number of functional groups such as pyridine forms coordination bonds with 1D nanomaterials, N→Zn(II) or N→Al(III) as illustrated in FIG. 10a2; while double bonds in the hydrophobic segments react with the BCB groups in the responsive polymer to form covalent links between 1D nanostructures and the responsive polymer as highlighted in FIG. 10a2.

Examples of Block Copolymer Modifier

A block copolymer modifier should contain two segments. One block should react with metal species on surfaces of inorganic nanomaterials e.g.: acrylic acid, pyridine, bi-pyridine. The another block containing double bonds (vinyl group interchangeable) reacted with BCB groups in the responsive polymer matrix.

Figure 9:
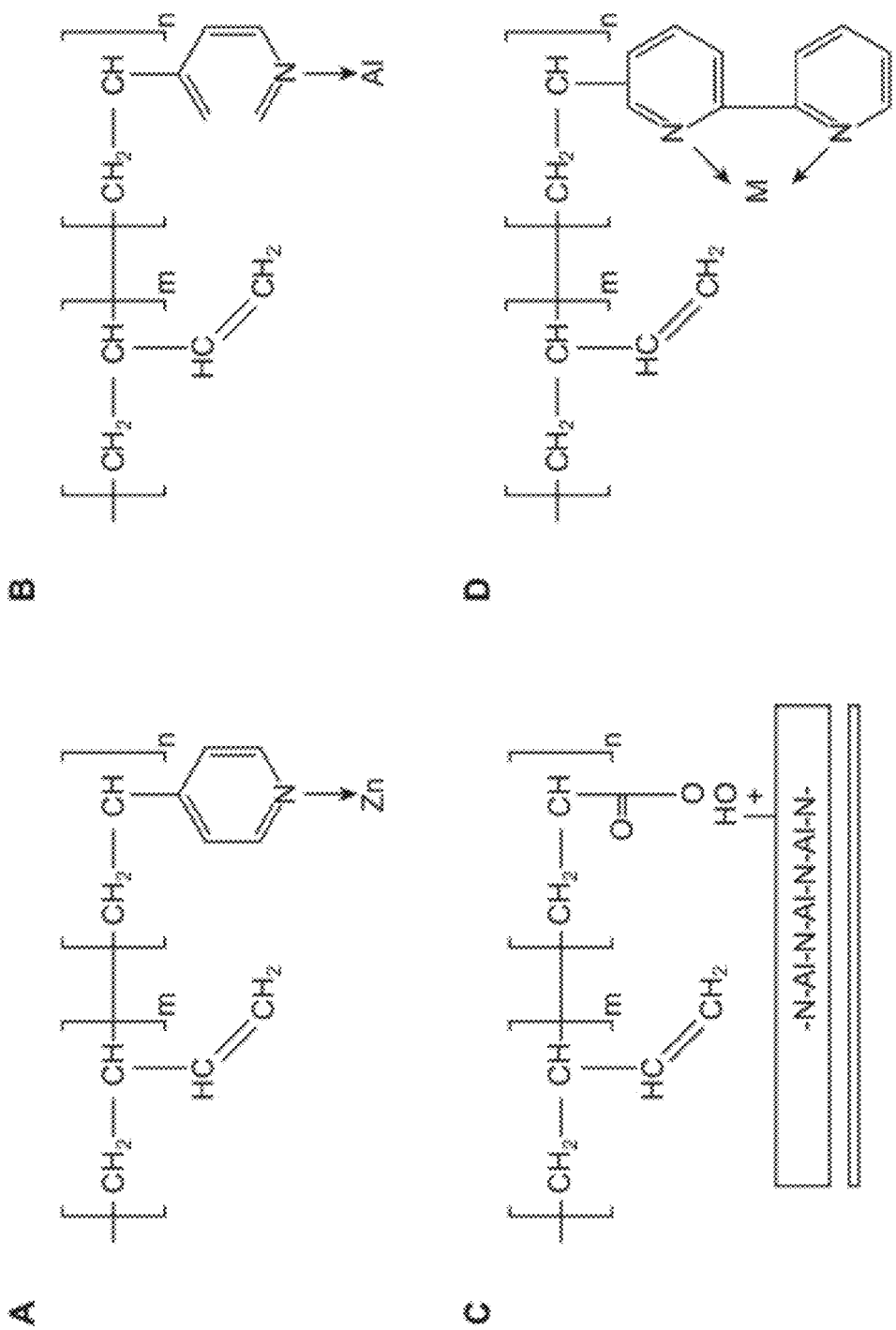
FIG. 9, panels A through D, contain examples of chemical structures of surface modifiers.

Engineering interface connectivity is essential to combine complementary properties controllably for optimal performance. A generalized interface engineering approach as described herein is to employ surface modifier either diblock copolymers that consist of two reactive segments with or without spacer as depicted in FIG. 9. The vinyl-containing segment will form covalent linkages with benzocyclobutene groups on polymer chains by Diel-Alder reaction while the other segment will be chosen to form strong bonding with 1D nanomaterials. The surface modifiers chosen for the propose work can be divided into two categories:

1. Vinyl-Containing Diblock Copolymer for Transition Metal Rich Surfaces (a) Pyridine-Based Vinyl-Containing Block Copolymer. (a, b, d)

Poly(isoprene(1,2 addition)-b-4-vinyl pyridine) (PI-b-PVP, a, b) or other known in the art such as vinyl bipyridine (d), terpyridine, Without being bound by theory, hydrophilic ZnO or AlN or Ni/Fe preferentially interacts with 4-vinyl pyridine via not only Van der Waal force but also coordination bonds (shown in FIG. 9 a,b) for example will form strong coordination bonds with Lewis acids by donating the free pair of electrons on N. The hydrophilic nature of ZnO or AlN or Ni/Fe will promote this reaction and also facilitate this segment wrapping around 1D nanomaterials via Van der Waal interaction.

To increase interface interfacial bonding strength, bipyridine-based (d) and terpyridine-based diblock copolymers can be used as well as pyridine. Pyridine groups can form coordination bonds with a variety of transition metals, Fe, Ni, Co in 1D magnetic material, Pb nanostructures, $Pb^{2+}$ and $Ti^{3+}$ in PZT type ternary perovskite 1D ferroelectric nanomaterials and $Al^{3+}$ and $Zn^{2+}$ in binary piezoelectric material 1D nanomaterials.

(2b) Acrylic Acid-Based Vinyl-Containing Block Copolymers.

AlN can be viewed as a Lewis base, due to the nitrogen. Examples of this effect would be poisoning chemically amplified resists ob metal nitride layers such as TaN. The dangling bonds existing on surfaces will be readily terminated by acid, resulting in the formation of ionic bonds with acrylic acid groups in the hydrophilic block of between $Al^{3+}$ and COO⁻, bountiful in poly(butadiene-b-acrylic acid), (c). In a similar fashion, Ti species in 1D piezoelectric ferroelectric nanomaterials such as $BaTiO_3$ and $PbTiO_3$, and Ni or Fe in 1D magnetic bars nanostructures can form ionic bond with acrylic group. To increase hydrophobicity, poly(methylacrylic acid) can be used instead of acid-based copolymers.

The interfacial adhesion between polymer matrix and 1D nanomaterials can be adjusted by the number of vinyl-containing repeat units and BCB groups in the polymer precursor.

Cycloaddition—Low Shrinkage Crosslink Reaction

After surface functionalization with block polymers, responsive polymers are introduced and aligned along with the surface topography formed by nanostructures or on the underlying substrate. Additional external force such as mechanical flow created by purging inert gas during anneal (thermally facilitated self-assembly process) will be used to induce alignment. Thermal crosslinking between benzocyclobutane BCB and vinyl groups is achieved by the Diels-Alder reaction, resulting in strong covalent connectivity between inorganic nanostructures and organic polymers. Additional thermal or photocrosslinking prior to this step for side-chain azobenzene polymers enhances the mechanical integrity. By adjusting the chain length of metal binding repeat units, the interaction between the surface modifier and inorganic 1D nanomaterials can be tailored. FIG. 10a depicts the crosslinking process. Thermally crosslinkable BCB groups react with double bonds above 200° C. as verified by differential scanning calorimetry (DSC analysis) as shown in FIG. 10b.

There is very low shrinkage associated with the cycloaddition reaction between the polymer matrix and 1D nanomaterials thus forming covalent linkages between the surface modifier and polymer with minimum residual stress.

The bonding strength between the polymer matrix and 1D nanomaterials can be adjusted by the number of vinyl groups on 1D nanomaterials and BCB sites on the polymer available for reaction. This controls the coupling force between the surface modifier and the responsive polymer. The interface adhesion between the interface modifier and 1D nanomaterial is controlled by (i) the reactive sites, dangling bonds, on 1D nanomaterials which can be tailored by some extent, (ii) the number of bonding sites available on a surface modifier and bonding strength.

Surface defects termination will improve photon and phono transport in 1D nanomaterials. Such tunability will enable the creation optimal connectivity for specific applications. This simple and powerful approach is applied to a wide spectrum of heterogeneous systems.

Nanomaterial-Responsive Polymer Composite

This disclosure also provides a nanomaterial-responsive composite material and methods of making it. The method comprises, or alternatively consists essentially of, or yet further consists of depositing a responsive polymer and one or more nanomaterial provided on a substrate and then curing and optionally removing a sacrificial underlayer to provide the composite material.

Further provided is the composite material(s) made by the methods of this disclosure. The composite material comprises, or alternatively consists essentially of, or yet further consists of one or more of substantially aligned nanomaterials wherein the nanomaterials are generally extended in a direction parallel to the substantial thickness of a substrate, in connection with the one or more nanomaterials and/or responsive polymer, wherein the nanomaterials are covalently attached to the responsive polymer. In one aspect, the nanomaterials and responsive polymer are covalently coupled via Diel's Alder reaction of benzocyclobutane with the double bonds in the nanomaterials (see FIG. 10b).

Nanomaterials useful in the methods and compositions are described above and include, but are not limited to, CNTs, piezoelectric 1D nanomaterials, 1D nanotubes, 3D nanotubes, nanowires, nanorods, nanobelts and suspended nanotubes and suspended nanowires which may be further surface modified. The nanomaterials have a general diameter as described above, for example from about 0.5 nm to about 1000 nm, alternatively from about 0.5 nm to about 500 nm; alternatively from about 0.5 nm to about 100 nm, alternatively from about 0.5 nm to about 50 nm and alternatively from about 0.5 nm to about 10 nm. In a preferred embodiment, the nanomaterials have a general diameter from about 0.5 nm to about 2 nm.

Any of the responsive polymers described above can be used in the method and the composite material. Non-limiting examples include, but are not limited to, polyamides containing at least one of benzocyclobutane, PEG, azobenzene, and vinyl groups, or a combination thereof.

Nanomaterials have extremely large surface areas so that they can be effectively embedded into the polymeric matrix and capable of forming thin films for device-based applications. Compared to most polymeric materials, inorganic nanomaterials have much higher strength and Young's modulus. With fewer defects, they can be more elastic than their bulk counterparts (Kaplan-Ashiri et al., "On the mechanical behavior of WS2 nanotubes under axial tension and compression", Proc Natl Acad Sci USA 2006, 103 (3), 523-528; Wu et al., "Mechanical properties of ultrahigh-strength gold nanowires", Nat Mater 2005, 4 (7), 525-529). If strong interfacial coupling with the polymer system can be made, polymer-nanomaterial hybrids can show greatly enhanced mechanical integrity resulting from the "nanomaterial reinforcement" effect. Consequently, the number of cycles before failure can be considerably improved. The switching frequency can also be greatly increased as a result of enhanced elasticity (Yang et al., "Reversible infrared actuation of carbon nanotube-liquid crystalline elastomer nanocomposites", Adv Mater 2008, 20 (12), 2271-2275).

Fabrication Methods

Monolithic Synthesis and Fabrication of Nanohybrid Thin Films

In this disclosure, two methods will be offered to blend polymer and nanomaterials. In one embodiment, 1D nanomaterials are dispersed in polymer matrix. The mixture will be introduced onto a prepatterned substrate shown in FIG. 11a by casting or flow into microfluidic channel with the top flat top plate and bottom substrate textured with lines. The surface topography serve as guide to coax 1D nanomaterials and polymer chains coself-assemblied and will be aligned along the length of the groves as described herein.

In another embodiment, direct synthesis of nanostructures on device platforms will be used. After the formation of order 1D nanomaterials, polymer will then be infiltrated. This method eliminates the need for separation, purification and dispersion of nanostructures which have been persistent major challenges. Their spatial locations and structure orientation is controlled by surface topography, substrates, catalyst composition, and placement (Lu et al., Nano Letters 2008, 8, 3325-3329; Greene et al., Nano Letters 2005, 5, 1231-1236). The lack of control over spatial location and orientation during post process manipulation is no long a concern as described herein.

Self Alignment of Responsive Polymer with Nanomaterials

The surface topography formed after nanomaterial synthesis, e.g. 1 D nanomaterial, is used to direct responsive polymer orientation. Alternatively patterned substrates can be used to aligned both 1D nanomaterials and responsive polymers Photo or thermal cross-linking is used to "lock in" the order. Metal electrodes are formed using a bilayer process.
Nanohybrids: Responsive Polymers-Piezoelectric Materials as Example Surrounding piezoelectric based nanostructures in a highly responsive polymer provides a new hybrid material system which can acutely detect and magnify dynamic change of light and thermal energy and then convert them into electricity. The polymer network is "reinforced" by nanomaterials. Consequently, the polymer hysteresis and fatigue nature can become "invisible". This new material platform, for the first time, thus opens new opportunities for the fundamental study of energy transfer and conversion at nanoscale and molecular level.

In one embodiment, this disclosure provides a transducer system. The system an array of substantially aligned nanomaterial embedded in responsive polymers with electrodes on sides or top/bottom.

Any suitable electrodes maybe used, such as Schottky contacts, pn junction diode contacts, metallic ohmic contacts (such as gold or copper contacts), conductive organic contacts, such as conductive polymer contacts, and semiconductor contacts, such as doped polysilicon contacts. The electrodes may have any suitable shape, such as bulk chip structures (i.e., junction diodes, etc.), thin films and wires having dimensions that are sufficiently small to contact the nanomaterial in the conductive channels.

Figure 13:
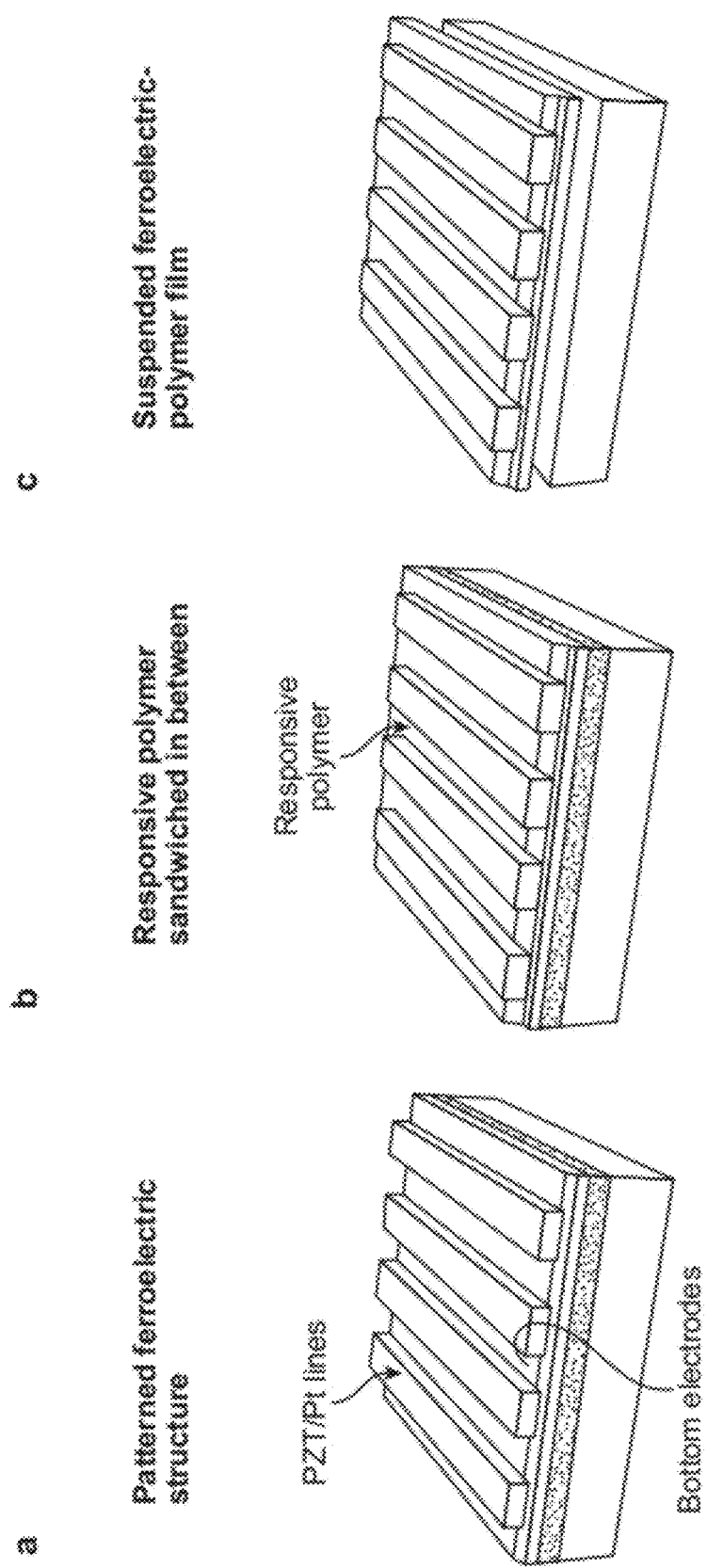
FIG. 13, panels a-c illustrate responsive ferroelectric-polymer suspended thin film composites with top-bottom electrode configuration.

In one embodiment, this disclosure provides a transducer system comprising, or alternatively consisting essentially of, or yet further consisting of the responsive-polymer hybrid material described above and a first and second electrode attached to the nanomaterial on opposing ends of the nanomaterial (or top and bottom, see FIG. 13). In one aspect, the sensor system comprises or alternatively consists essentially of, or yet further consists of:

(a) one or more substantially aligned nanomaterials embedded and covalently attached to a responsive polymer, wherein the responsive polymer comprises, or alternatively consists essentially of, or yet further consists of, a rod segment that deforms upon light stimulation and a coil segment that deforms upon thermal stimulation;

(b) a first electrode contacting nanostructures on a first portion of the at least nanomaterial; and (c) a second electrode contacting nanostructures on a second portion or opposing end of the nanostructures.

In one aspect of the transducer system, the responsive polymer comprises a rod polyamide segment comprising azobenzene groups that deforms upon light stimulation and a coil polyethylene glycol segment that deforms upon thermal stimulation.

In another embodiment, this disclosure provides the above nanostructures system, wherein the information relating to a physical condition comprises at least one of thermal effects, stress, strain, static build up, crack content, fracture content, and breakage will be manifested by monitoring the properties of 1D nanostructure, optically, electronically, magnetically.

In another embodiment, current will be generated by harnessing light and thermal fluctuation. Light and heat fluctuation can in turn be used for actuation for signal modulation or switching. This can be accomplished by incorporation of a plate or shield that prevents a portion of the composite from light and/or heat. The shield can be any object such as plastic, metal, wood, paper, cardboard, cement, or a natural element like a tree that partially shields the composite.

Effect of Light and Temperature on the Polymeric Transducer Material

Figure 16:
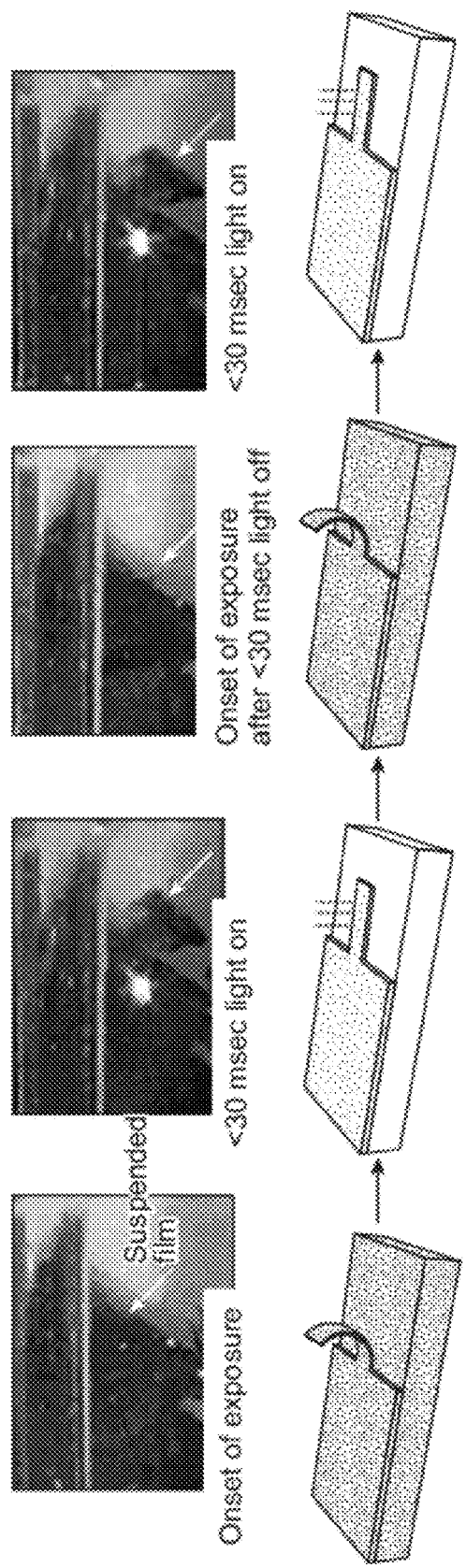
FIG. 16 illustrates film bending and flattening upon visible light illumination. The cartoon below illustrates the film photo responsiveness. (Note: The film was covered by a glass slide to remove the effect of air movement.)

Applicants investigated the effect of light on the polymeric transducer material of this disclosure. FIG. 16 is a set of digital camera images cropped from a video showing that the polymeric transducer material of this disclosure was bent and unbent instantaneously by blocking and unblocking sunlight. Most of the film surface was adhered to a glass substrate while a small section of film was not attached. Blocking the film from sunlight causes the suspended portion of the film to immediately bend upward to roughly 90 degrees. Exposing the film to sunlight flatten the bent portion instantaneously. After 100 cycles, no visible sign of degradation was detected. This polymer film deformed using less than 5% of the light intensity reported for other polymer systems. (9) Applicants conjure that this is due to the combination of (a) unique "rod" and "coil" segment arrangement with (b) a collective action from an ensemble of azobeneze groups.

Applicants also investigated the effect of temperature on the polymeric transducer material of this disclosure. The film in this case contained dispersed CNTs in the responsive polymer. A two-stage curing was carried out to form covalent linkage between polymer and CNTs and between polymer chains. The plot in FIG. 17 is the DSC data showing an exothermic peak around 230° C. which is associated with BCBs reacting with CNTs. The set of digital camera images demonstrated that this polymer film was very sensitive to thermal fluctuations around room temperature. The CNT-based hybrid thin film curled up rapidly when it was moved to the 40° C. zone and then straightened instantaneously when moved to the 35° C. zone. No visible sign of fatigue was observed after 100 cycles. The experimental details of the effect of light and temperature on the polymeric transducer material of this disclosure are described in detail herein in Example 10.

Man-Made Light or Heat Fluctuation

In one aspect, this disclosure provides a system of the responsive polymer composite and a plate or other material which acts to shield or shade the polymer from light or heat. For example, a plate partially covered the composite film that upon radiation, will cause the polymer to bend to the shade and then upon removal of the light and/or heat the film will be again become unbent. By doing so, the film will be dynamically bent under static light and heat radiation electricity.

The foregoing and other aspects of the present disclosure may be better understood in connection with the following representative examples.

EXAMPLES

The following abbreviations are used throughout this disclosure.
AFM=atomic force microscopy/atomic force microscope
CNT=carbon nanotube
IR=Infrared spectroscopy
nm=nanometer
min=Minute
m=Meter
° C.=Degrees Celsius
THF=tetrahydrofuran
DMF=dimethylformamide
DMSO=dimethylsulfoxide
DMAc=N,N-dimethylacetamide
NMR=Nuclear magnetic resonance
mg=milligram
mmol=millimole
mL=Milliliter
μL=microliter

Example 1

Synthesis of Coil Segment

PEO-COOH was purchased from Sigma-Aldrich. PEO-COOH (PEG2000, 219.8 mg, 0.1155 mmol) was dissolved in anhydrous N-methylpyrrolidone (NMP) (5 mL in DMF and DMAc) in a 20 mL reaction tube and the reaction tube was placed in an ice water bath. When the reaction tube was cooled down around 0° C., excess thionyl chloride (18.0 μL, 0.242 mmol) was added under $N_2$ protection to convert PEO-COOH to PEO-COCl. The reaction mixture was stirred for prolonged time (5 hrs) to achieve full conversion.

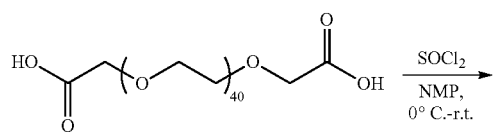

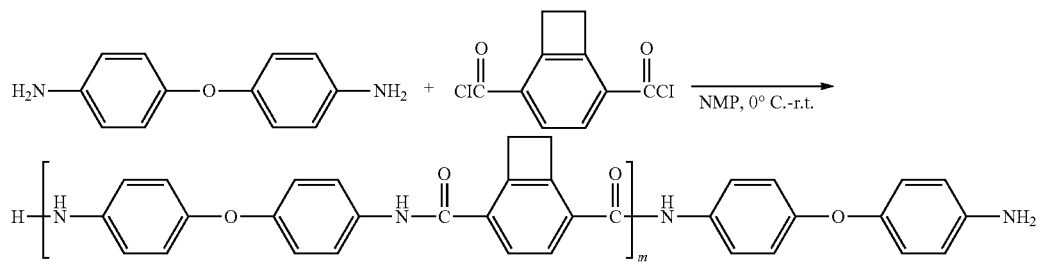

Example 2

Synthesis of Rod Segment

To a flask containing 4,4'-oxydianiline (220.3 mg, 1.1 mmol), 5 mL anhydrous NMP was added and was cooled down to around 0° C. In an addition funnel, 1,2-dihydrocyclobutabenzene-3,6-dicarbonyl dichloride (229.1 mg, 1 mmol) in 5 mL NMP was dislodged. This solution was added to the flask containing 4,4'-oxydianiline and the mixture was stirred for 24 hours while the temperature gradually rose up to room temperature. Value of m in the following scheme ranges from 10 to 40.

Example 3

Synthesis of Heat-Sensitive Coil-Rod Segment

The reaction mixture from example 2 was transferred from the reaction tube into the three neck round bottom flask containing product of example 1 using a double head needle under $N_2$ protection. The reaction was continued for 24 hours with stirring while the temperature gradually roses up to room temperature. The mixture was poured into 120 mL acetone (THF) in a 250 mL beaker with stirring to remove the side products and unreacted starting materials if any. After vacuum filtration and washing with acetone three times, the product was extracted with THF in a soxhlet extraction apparatus for further purification. After the color of THF in the thimble became clear, the final product was put into a vial and dried in vacuum oven overnight.

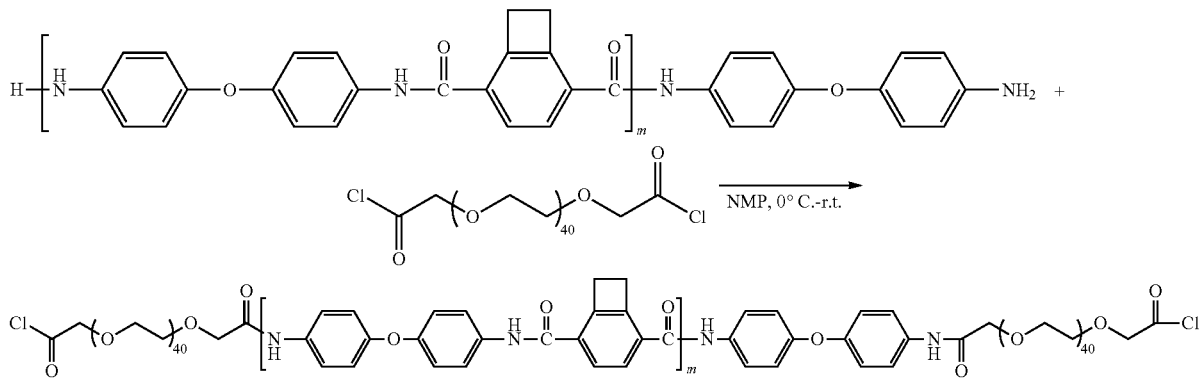

Example 4

Synthesis of Light Sensitive Polymer Block 1

After addition of 4,4'-azodianiline (222.9 mg, 1.05 mmol) and CaCl$_2$ (177.6 mg, 1.6 mmol) into a 50 mL flask, 20 mL anhydrous NMP was added and the flask was cooled down to around 0° C. In an addition funnel, 1,2-dihydrocyclobutabenzene-3,6-dicarbonyl dichloride (229.1 mg, 1 mmol) in 5 mL NMP was dislodged. This solution was added to the flask containing 4,4'-azodianiline and the mixture was stirred for 24 hours while the temperature gradually rose up to room temperature. The reaction solution was used directly for coating.

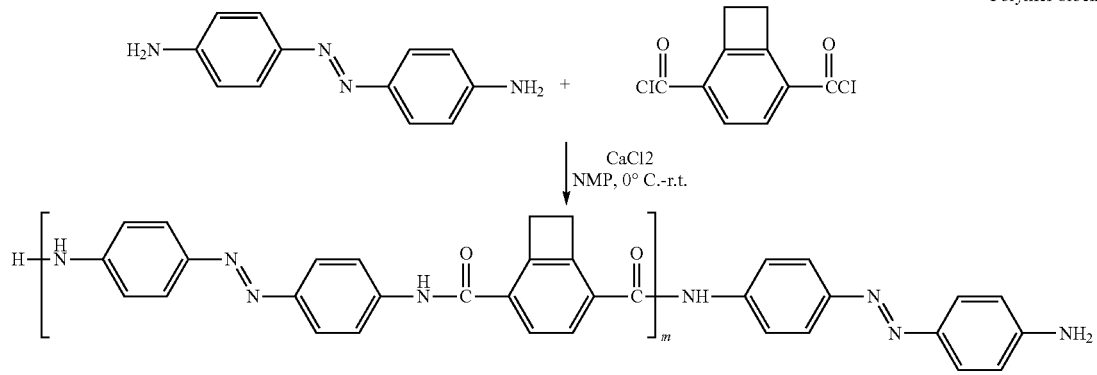

Polymer block 1

Example 5

Synthesis of Light Sensitive Polymer Block 2

After addition of 4,4'-azodianiline (148.6 mg, 0.70 mmol) and 3,4'-oxydianiline (68.1 mg, 0.33 mmol) into a 50 mL flask, 20 mL anhydrous NMP was added and the flask was cooled down to around 0° C. In an addition funnel, 1,2-dihydrocyclobutabenzene-3,6-dicarbonyl dichloride (101.0 mg, 0.44 mmol) and terephthaloyl dichloride (89.3 mg, 0.44 mg) in 10 mL NMP were dislodged. This solution was added to the flask containing 4,4'-azodianiline and the mixture was stirred for 24 hours while the temperature gradually rose up to room temperature.

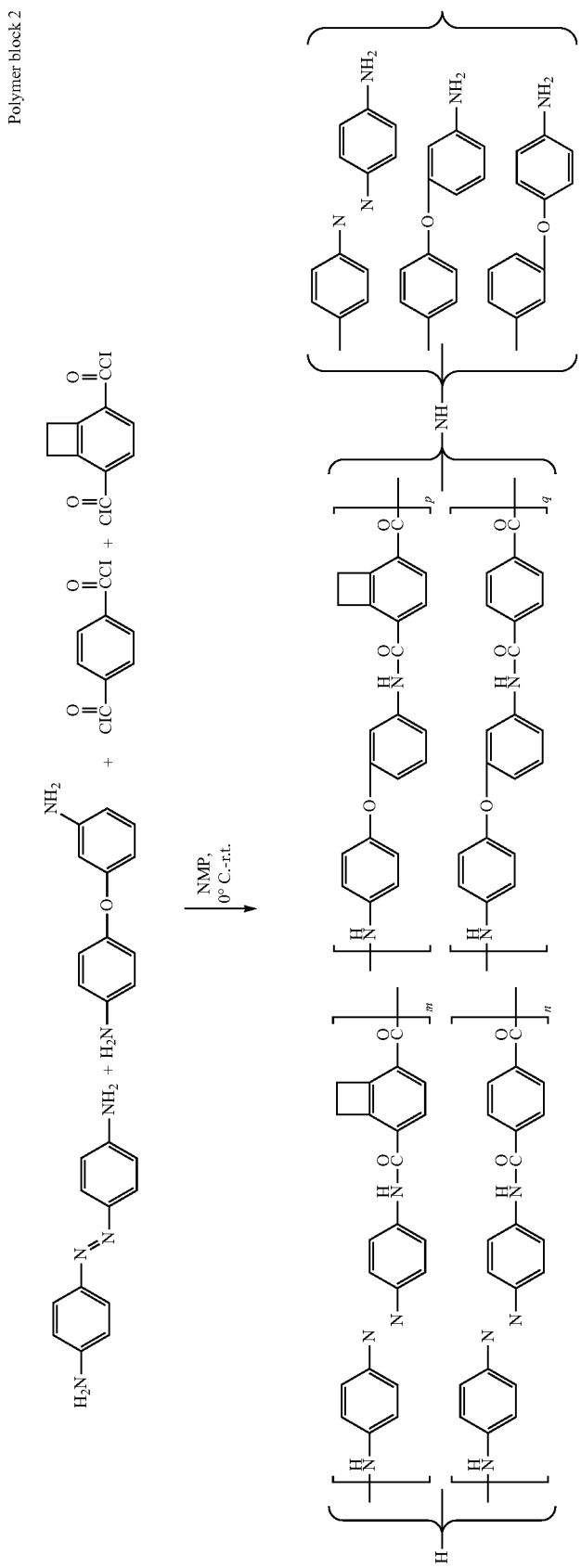

Example 6

Synthesis of Only Light Sensitive Polymer Block 3 Using Dodecanedioyl Dichloride After addition of 4,4'-azodianiline (294 mg, 1.39 mmol) and CaCl$_2$ (156.5 mg, 1.4 mmol) into a 50 mL three neck round bottom flask, 20 mL anhydrous NMP was added and the flask was cooled down to around 0° C. In an addition funnel, 1,2-dihydrocyclobutabenzene-3,6-dicarbonyl dichloride (167 mg, 0.63 mmol) and dodecanedioyl dichloride (170 μL, 0.67 mmol) in 10 mL NMP were dislodged. This solution was added to the flask containing 4,4'-azodianiline and the mixture was stirred for 24 hours while the temperature gradually rose up to room temperature. The reaction solution was used directly for coating.

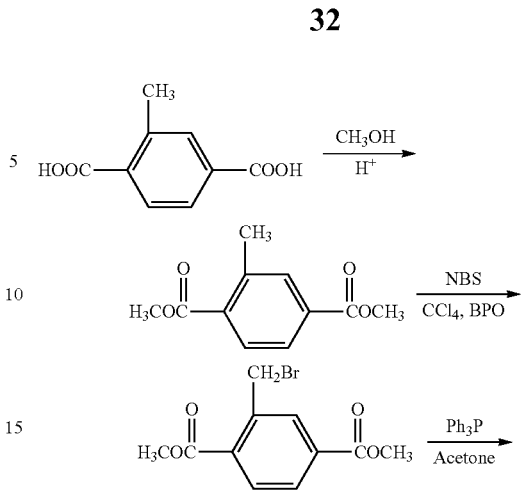

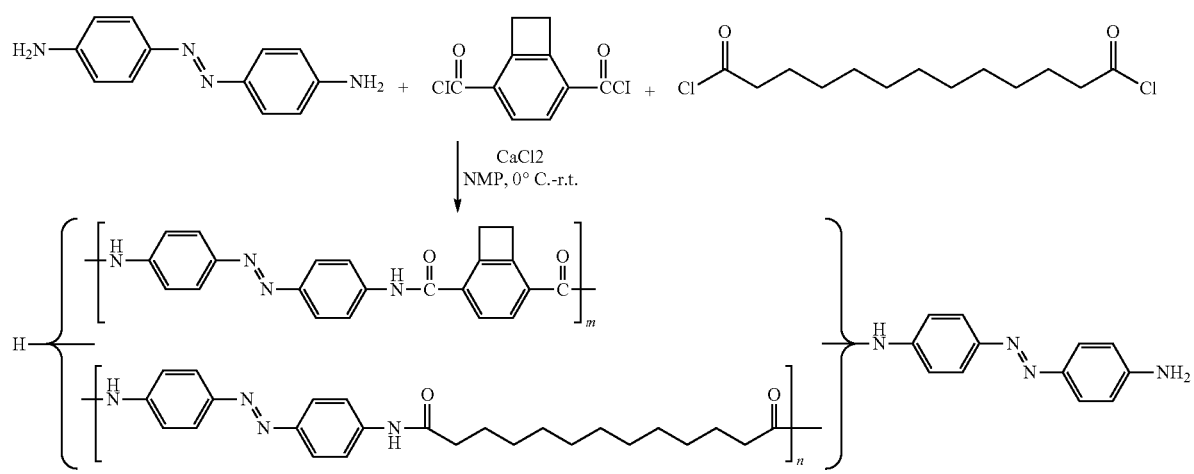

Polymer block 3

Example 7

Synthesis of Polymer Block 4 Containing Vinyl Groups

Using the methods described above, the following block polymer 4 containing vinyl groups is synthesized in an analogous manner. Synthesis of double bonds are describe below.

Synthesis of Double Bond Modified Terephthaloyl Chloride:

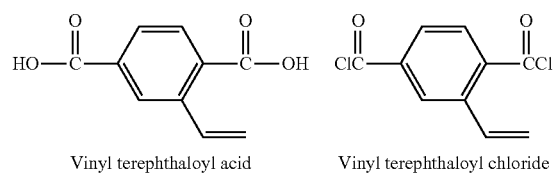

Vinyl terephthaloyl acid     Vinyl terephthaloyl chloride

Vinyl terephthaloyl acid could be synthesized as described in Yuxiang Liu, et al. (1998) Chinese Journal of Polymer Science 16(3):283-8).

-continued

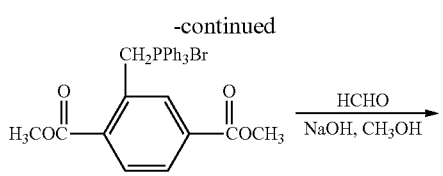

(Reproduced from Yuxiang Liu, et al. (1998), supra.)

Alternatively, it could be synthesized as the following procedure:

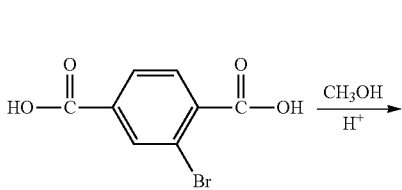

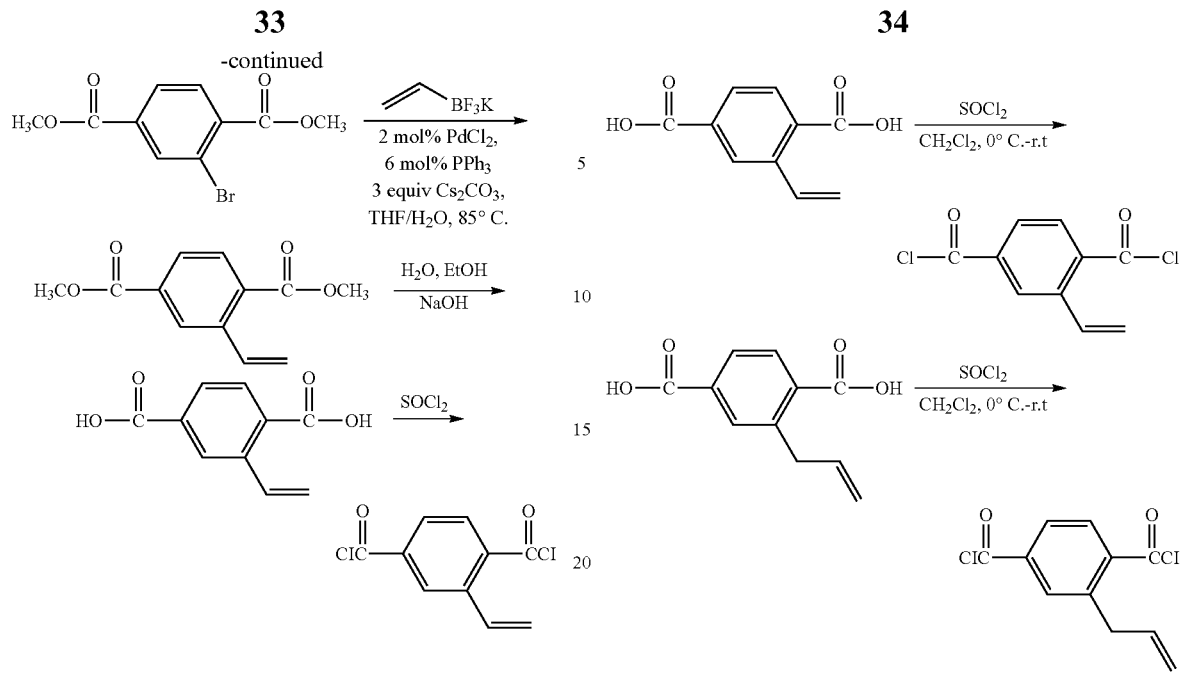

Synthesis of 2-Bromo Dimethyl Terephthalate 2-bromo terephthaloyl acid (1.23 g, 5 mmol) was added to a 50 mL round bottom flask and then dissolved by 10 mL absolute methanol. 200 uL of concentrated sulfuric acid was added and then gently for 8 hours. After removing solvent by rotevaporator, the residue was dissolved in toluene and washed in turn with saturated salt water for two times, sodium carbonate solution for 3 times, and saturated salt water to neutrality. Small amount of sodium sulfate was added into the solution and then toluene was removed by rotaevaporator. The residue was recrystallized in petroleum to get 2-bromo dimethyl terephthalate.

Synthesis of Vinyl Dimethyl Terephthalate

Then a solution of potassium vinyltrifluoroborate (134 mg, 1.00 mmol), $PdCl_2$ (3.5 mg, 0.02 mmol), $PPh_3$ (16 mg, 0.06 mmol), $Cs_2CO_3$ (978 mg, 3.00 mmol), and dimethoxyl 2-bromo terephthalate (273.1 mg, 1.00 mmol) in $THF/H_2O$ (9:1) (2 ml) was heated at 85° C. under an $N_2$ in a sealed reaction tube. The reaction mixture was stirred at 85° C. for 22 hours then cooled to room temperature and diluted with $H_2O$ (3 ml) followed by extraction with $CH_2Cl_2$ (10 ml*3). The solvent was removed in vacuo, and the crude product was purified by silica gel chromatography (eluting with 20:1 n-pentane/ether) to yield 2-vinyl dimethyl terephthalate. (Molander and Brown (2006) J. Org. Chem. 71:9681).

Synthesis of Vinyl Terephthaoyl Acid 2-vinyl dimethyl terephthalate (220 mg, 1 mmol) will added into a mixture of 5 ml of methanol, 0.2 g NaOH, 1 ml of $H_2O$ and heated to 50° for a few hours. Methanol was evaporated out and the residue was vacuum filtrated and recrystallized in alcohol and water to get pure vinyl terephthaoyl acid (Yuxiang Liu, et al. "Synthesis of a novel mesogen-jacketed liquid crystal polymer based on vinyl-terephthalic acid," Chinese Journal of Polymer Science (1998) 16(3):283-8)).

Synthesis of Vinyl Terephthaoyl Chloride

Vinyl terephthaoyl acid (192 mg, 1 mmol) was added into a reaction tube and 2 ml of $CH_2Cl_2$ will be added and cool down to 0° C. Then $SOCl_2$ (44.6 μL, 0.6 mmol) and two drops of DMF was added to the solution. After stir for 5 hours. The solvent will be removed in vacuo. The product was stored under $N_2$.

Example 8

Figure 12:
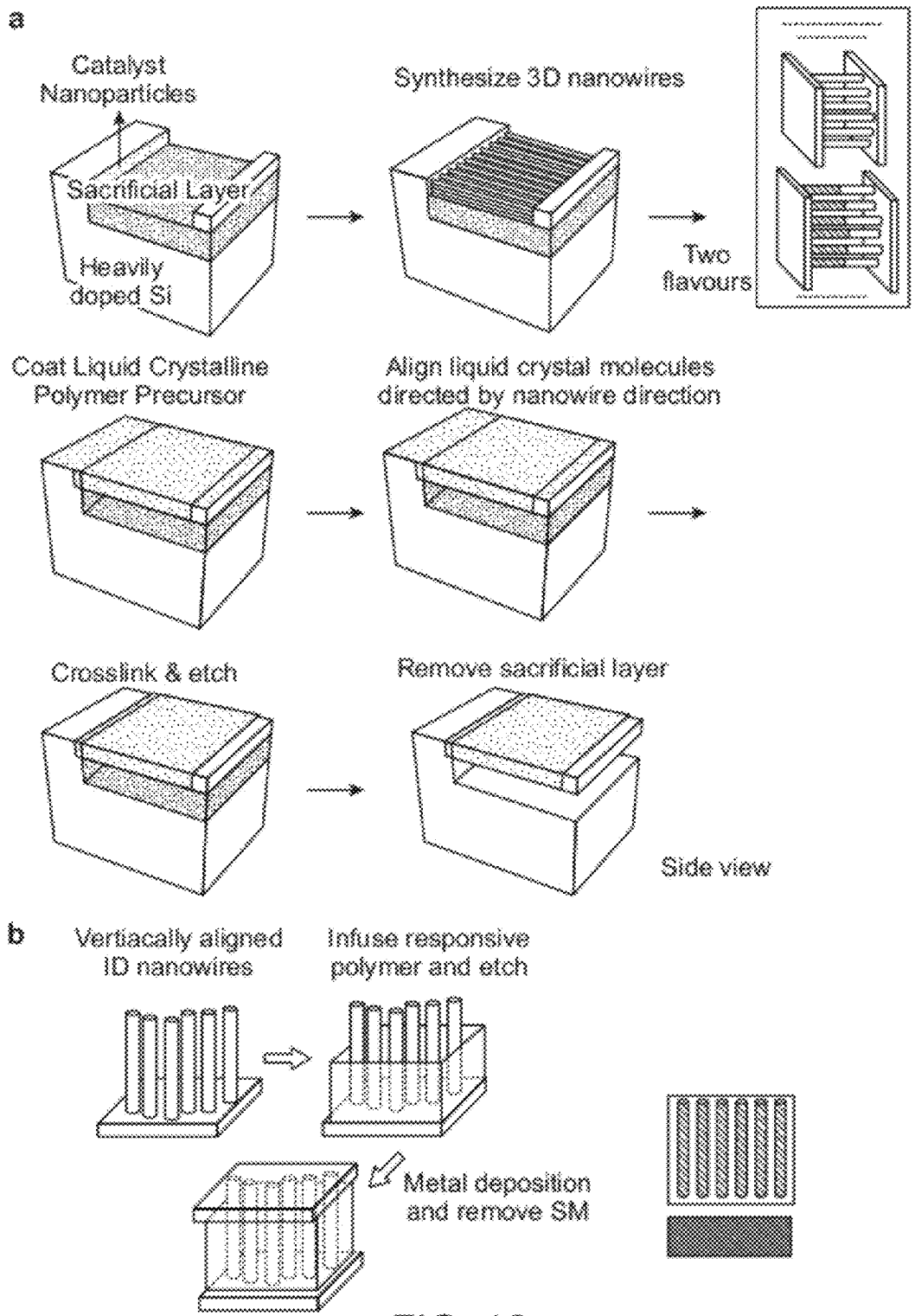
FIG. 12, panels a and b depict two schematic process flow of creating 3D nanowires-responsive polymer hybrid films, (a) horizontally aligned nanostructures; (b) vertically aligned nanostructures.

Monolithic Synthesis and Fabrication of Nanohybrid Thin Films Using Horizontally Aligned 1D Nanostructures By depositing catalysts on one side of the trench, horizontally aligned 1D nanostructures can be formed. If the trench material is heavily doped Si, thus they can serve as a pair of electrodes. Alternatively, sequential growth can be done by first growing ZnO nanowire as an example and then carbon nanotube (electrode) subsequently. In this case reduced parasitic capacitance can be achieved using nanoelectrodes. A universal surface modifier will be used decorate the surfaces with vinyl groups. The responsive polymer precursor will then be filled in the gap. See FIG. 12. The morphology created by the elongated 1D structures then guides the orientation of responsive polymers. During the thermal anneal process, the responsive polymer will be aligned along the length of the 1D nanostructures. Cross-linking is performed to freeze the ordered responsive polymer morphology and form covalent linkage with 1D nanostructures.

Upon heating around the order to disorder transition temperature or photon radiation, highly malleable and responsive polymer morphing and impose strain onto 1D piezoelectric materials. The change of the displacement of dipoles in piezoelectric materials as a consequence induces electricity by converting strain energy into charges. Due to the dynamically coupling piezoelectric 1D nanomaterials with the responsive polymer, enabled by this disclosure, strain energy generated by heat and light variation and vibration can be effectively transferred into piezoelectric 1D nanomaterials and converting electricity.

Theoretical calculations and experiments show that composite materials can have higher figures of merit and coupling factors, leading to higher power generation. (Gross, L. E. (1996) Materials Chemistry and Physics 43:108-115; Pouskouleli, G. (1989) Ceramics International 15:213-229; Silva, E. C. N. (1999) Archives of Computational Methods in Engineering 6:117-18).

By using this direct synthesis approaches, both orientation and spatial distribution of 1D nanostructures is controlled.

Alternatively starting with vertically aligned 1D nanostructures, infiltrating with responsive polymer and followed by anneal and crosslink, etch back will be performed to reveal 1D nanomaterials, the second electrode will be attached after lithographically controlled selective deposition shown in FIG. 12b.

Example 9

Using Nanobelts Arrays on a Surface with Top-Bottom Electrodes

Patterned piezoelectric lines such as PZT(lead zirconium titanate) can be generated by PLD (pulsed plasma deposition) followed by lift-off shown in FIG. 13a. Thermal annealing and electrical poling will be performed to generate crystalline thin film with aligned dipole moment. A universal surface modifier will be used decorate the surfaces with vinyl groups. The responsive polymer precursor will then be infiltrated into the spaces as displayed. A annealing process will induce polymer chain aligned along the ferroelectric lines. Thermal treatment will then be carried out to crosslink the responsive polymer film itself and also form covalent linkages between the responsive polymer and ferroelectric materials. After removal of the underlying sacrificial layer, a suspended thin film will be formed as illustrated in FIG. 13c. By creating a PZT-polymer nanocomposite, the maximum energy output ($g_{ij}*d_{ij}$) is expected to increase dramatically. Conversely, an electrical input will produce greatly enhanced strokes. Since the polymer film will deform readily in response to light and heat fluctuations, such dynamic strain energy can be directly transformed onto PZT lines embedded in between, the suspended film will not only harvest kinetic energy but also thermal and solar energy as well.

Example 10

Magnetic Bars Formed by Top-Down Lithography Embedded in Responsive Polymer Matrix A patterned photoresist layer can be generated by using either conventional photolithography or the block copolymer template approach. A stack of ferromagnetic thin films designed to achieve high magnetic moment will be deposited. After removal of the polymer template, rod shaped magnetic structures will be created and then functionalized with a vinyl-containing universal surface modifier. Finally, the highly responsive polymer precursor can be cast and thermally crosslinking reaction will be taken place to generate a thin composite film. This new class of magnetic thin film combines highly sensitive nature of the responsive polymer with ferromagnetic properties offered by the magnetic structures will be generated. FIG. 14a is the conceptual drawing of the proposed polymer-ferromagnetic composite thin film. The metal lines will be deposited afterward as shown in FIG. 14b to conduct AC electrical current resulting from fluctuations of magnetic field strength derived from dynamic deformation of the magnetic film upon light and heat stimulation. Thus a miniaturized electric generation device that can generate electricity shown in FIG. 14c from light and heat via ferromagnetic transduction can be created.

Example 11

Piezoelectric Nanomaterial-Responsive Polymer Film Based Actuator and Transducers Starting with nanobelt arrays and following the aforementioned process, hybrid films with interfaced reinforced by covalent linkage can be formed. Electrodes can be formed by an etch step to remove the polymer film on ends of nanobelts. A bilayer lift-off process is then followed to deposit metal electrodes on the ends of nanobelts. FIG. 15 describes the process flow and this material enabled new actuators and transducer.

Example 12

CNT-Based Responsive Materials

CNTs-Based Responsive Materials.

Carbon nanotubes (CNTs) are generally produced by three main techniques, arc discharge, laser ablation and chemical vapor deposition. To achieve diameter and locational controllable and create suspended tubes aligned horizontal in parallel to surface, catalyst-assisted chemical vapor deposition (CVD) is the process of choice. In this process, nanotubes grow at the sites of catalyst nanoparticle as the carbon-containing gas is broken apart.

In a typical example, the responsive polymeric precursor was coated directly on substrates coated aligned as-synthesized CNTs. After two-stage curing and removal of a sacrificial underlayer ($SiO_2$ or $Al_2O_3$), suspended thin films will be formed. The aligned nanostructures viewed as a structural guide promote polymer chain alignment along the longitudinal axis of the nanostructures for directional deformation.

Figure 11:
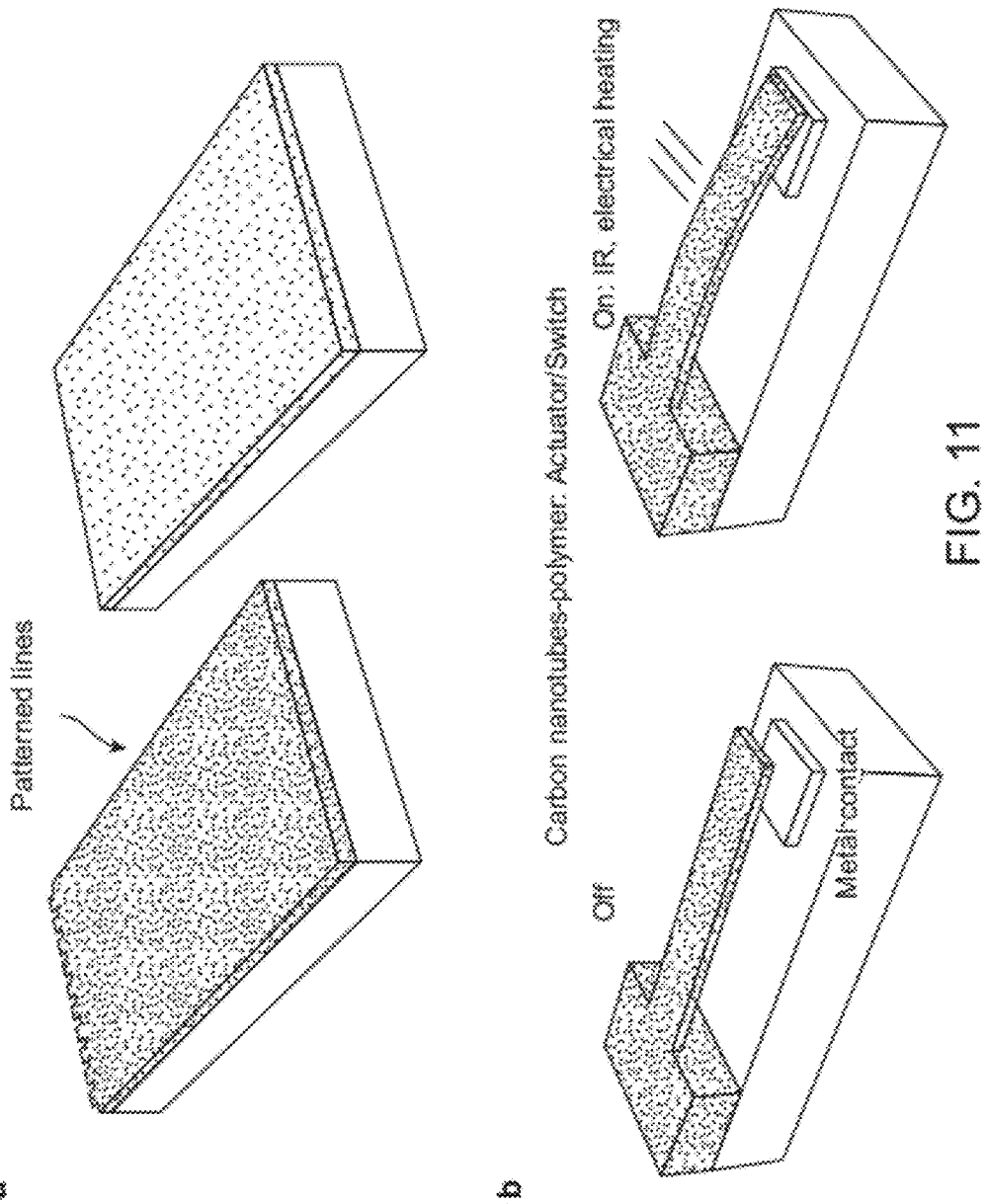
FIG. 11a illustrates aligned 1D nanomaterials and polymer molecules on a nanotextured surface.
FIG. 11b illustrates CNT-polymer enabled actuator.
Figure 18:
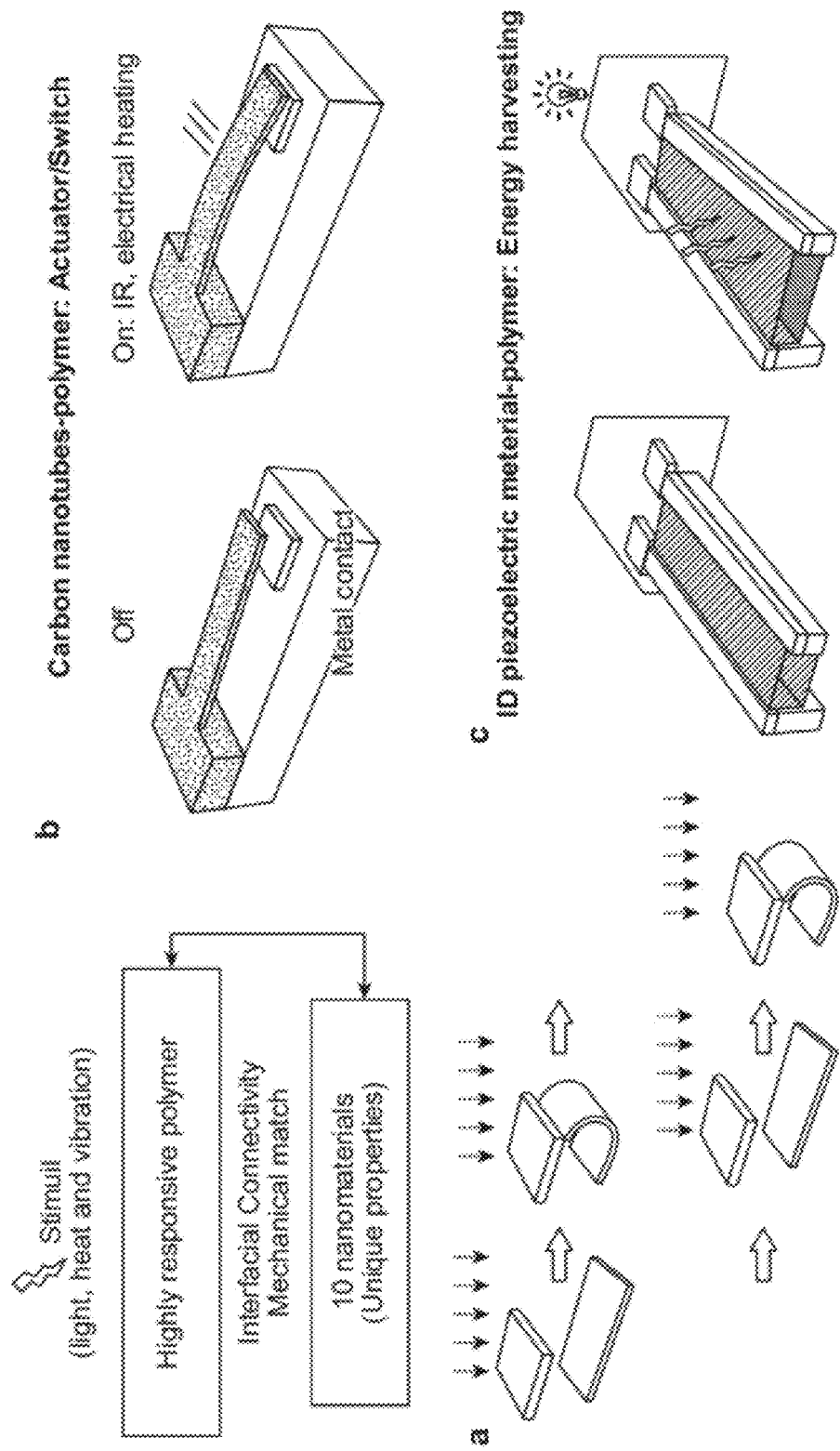
FIG. 18a shows an inventive design to generate autonomous bending in a static environment.
FIG. 18b shows generating dynamic strain energy in a polymer CNT composite film in response to light and heat fluctuation.
FIG. 18c shows a multifunctional energy scavenger device based on arrays of 1D piezoelectric nanobelts embedded in either optically or thermally responsive polymer matrix.

Alternatively CNTs are premixed with the responsive polymer precursors. CNT-based polymeric precursor solution can be coated on a substrate with stripped patterns for aligning both polymer molecules and 1D nanostructures, analogous to a rubbed polyimide surface used to align responsive polymers, crosslink reactions followed to "lock-in" the aligned morphology as illustrated in FIG. 11. Multi-walled CNTs are highly electrically conductive and their conductivity does not change upon stretching. (24) The incorporation of CNTs in thermal sensitive polymer can enhance electrical conductivity. CNTs are excellent heat absorbers, thus can form a metal-to metal contact switching device which can be addressed by IR light as shown in FIG. 18b.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above.

It is to be understood that while the disclosure has been described in conjunction with the above embodiments, that the foregoing description and examples are intended to illustrate and not limit the scope of the disclosure. Other aspects, advantages and modifications within the scope of the disclosure will be apparent to those skilled in the art to which the disclosure pertains.

What is claimed is:

1. A responsive polymer comprising a rod segment that deforms upon application of a light stimulation, a coil segment that deforms upon application of an external stimulation, and one or more crosslinked benzocyclobutane groups, wherein the rod segment and the coil segment are covalently attached to each other.

2. A responsive polymer comprising:
a plurality of polymer chains, each comprising a rod segment that deforms upon application of a light stimulation, a coil segment that does not deform upon application of an external stimulation, and one or more crosslinked benzocyclobutane groups, wherein the rod segment and the coil segment are covalently attached to each other.

3. A responsive polymer comprising:
a plurality of polymer chains, each comprising a rod segment that does not deform upon application of a light stimulation, a coil segment that does not deform upon application of an external stimulation, and one or more crosslinked benzocyclobutane groups, wherein the rod segment and the coil segment are covalently attached to each other.

4. The responsive polymer of claim 1, wherein the external stimulation applied to the coil segment is thermal stimulation.

5. The responsive polymer of claim 1, wherein the rod segment includes a polyamide comprising one or more of azobenzene, benzocyclobutane, acrylate, styrene monomers, or a combination thereof.

6. The responsive polymer of any one of claims 1 to 3, wherein the coil segment comprises at least one of a polyether or a polysiloxane, or a combination thereof.

7. The responsive polymer of claim 6, wherein the polyether comprises a polyethylene glycol having a molecular weight from 300 g/mol to 5,000 g/mol.

8. The responsive polymer of claim 7, wherein the polyethylene glycol is selected from PEG 600, PEG 1000, PEG 1500, PEG 2000, and PEG 4000.

9. The responsive polymer of any one of claims 1 to 3, wherein the rod segment further comprises a benzocyclobutane and/or a vinyl group.

10. A responsive polymer prepared by a method comprising:
(a) coupling a diamine with a dicarboxylic acid dihalide to provide a rod segment comprising a polyamide comprising azobenzene groups;
(b) coupling the product of step (a) with dicarboxylic acid dihalide comprising a polyether, a polysiloxane, or a combination thereof; and
(c) coupling the product of step (b) with a diamine to provide the responsive polymer.

11. A nanomaterial-polymer composite material comprising a plurality of nanomaterials each covalently attached to a matrix comprising the responsive polymer of any one of claims 1 to 3 or 10, wherein the plurality of nanomaterials are substantially parallel to each other and are covalently linked to the responsive polymer.

12. A transducer system comprising at least one one-dimensional nanomaterial comprising a plurality or array of substantially aligned nanomaterial covalently attached to a responsive polymer of any one of claims 1 to 3 or 10.

13. The transducer system of claim 12, further comprising:
(a) a first electrode attached to the transducer and
(b) a second electrode attached to the transducer.

14. A dynamic system comprising the nanomaterial of claim 11 and a means for partially shielding the nanomaterial from external stimulus.

15. The dynamic system of claim 14, wherein the external stimulus is one or more of heat or light.

* * * * *